US008784985B2

(12) United States Patent
Mukhopadhyay et al.

(10) Patent No.: US 8,784,985 B2
(45) Date of Patent: Jul. 22, 2014

(54) ANTI-REFLECTIVE COATINGS FOR OPTICALLY TRANSPARENT SUBSTRATES

(71) Applicant: Honeywell International Inc., Morristown, NJ (US)

(72) Inventors: Sudip Mukhopadhyay, Berkeley, CA (US); Yamini Pandey, Fremont, CA (US); Lea Dankers, Milpitas, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/023,616

(22) Filed: Sep. 11, 2013

(65) Prior Publication Data
US 2014/0011019 A1 Jan. 9, 2014

Related U.S. Application Data

(62) Division of application No. 12/796,199, filed on Jun. 8, 2010, now Pat. No. 8,557,877.

(60) Provisional application No. 61/268,231, filed on Jun. 10, 2009.

(51) Int. Cl.
H01L 31/0216 (2014.01)
C09D 5/00 (2006.01)
C03C 17/30 (2006.01)
H01L 31/042 (2014.01)
G02B 1/11 (2006.01)

(52) U.S. Cl.
CPC ........... H01L 31/02168 (2013.01); Y02E 10/52 (2013.01); C09D 5/00 (2013.01); C03C 17/30 (2013.01); H01L 31/042 (2013.01); G02B 1/111 (2013.01); C03C 2217/732 (2013.01); H01L 31/02161 (2013.01)
USPC ......................... 428/327; 428/447; 428/411.1

(58) Field of Classification Search
None
See application file for complete search history.

(56) References Cited

U.S. PATENT DOCUMENTS

| 31,987 A | 4/1861 | Nozaki et al. |
|---|---|---|
| 35,239 A | 5/1862 | Jacobs |
| 35,368 A | 5/1862 | Ehrman |
| 35,447 A | 6/1862 | Howard |
| 58,929 A | 10/1866 | Adams et al. |
| 106,376 A | 8/1870 | Kennedy et al. |
| 172,896 A | 2/1876 | Adams et al. |
| 677,386 A | 7/1901 | Teeguarden et al. |
| 2,783,263 A | 2/1957 | Merker |

(Continued)

FOREIGN PATENT DOCUMENTS

| DE | 19852852 | 5/2000 |
|---|---|---|
| DE | 102006046726 | 4/2008 |

(Continued)

OTHER PUBLICATIONS

Zhang et al. Journal of Sol-Gel Science and Technology, 33, 19-24, 2005.*

(Continued)

Primary Examiner — Robert S Loewe
(74) Attorney, Agent, or Firm — Faegre Baker Daniels LLP

(57) ABSTRACT

Anti-reflective coatings and coating solutions, optically transparent elements and improved processes for preparing AR coatings and coating solutions are described. The anti-reflective coatings are formed from at least two different alkoxy silane materials in a base catalyzed reaction.

17 Claims, 3 Drawing Sheets

(56) References Cited

U.S. PATENT DOCUMENTS

| | | |
|---|---|---|
| 3,294,737 A | 12/1966 | Krantz |
| 3,615,272 A | 10/1971 | Collins et al. |
| 3,635,529 A | 1/1972 | Nass |
| 3,784,378 A | 1/1974 | Gramas |
| 3,873,361 A | 3/1975 | Franco et al. |
| 3,884,702 A | 5/1975 | Koshimo et al. |
| 3,925,077 A | 12/1975 | Lewis et al. |
| 3,929,489 A | 12/1975 | Arcesi et al. |
| 4,018,606 A | 4/1977 | Contois et al. |
| 4,018,607 A | 4/1977 | Contois |
| 4,019,884 A | 4/1977 | Elmer et al. |
| 4,043,812 A | 8/1977 | Stolka et al. |
| 4,048,146 A | 9/1977 | Wilson |
| 4,052,367 A | 10/1977 | Wilson |
| 4,053,313 A | 10/1977 | Fan |
| 4,102,683 A | 7/1978 | DiPiazza |
| 4,191,571 A | 3/1980 | Nonogaki et al. |
| 4,257,826 A | 3/1981 | Matalone, Jr. |
| 4,290,896 A | 9/1981 | Gordon et al. |
| 4,299,938 A | 11/1981 | Green et al. |
| 4,308,371 A | 12/1981 | Tanaka et al. |
| 4,312,970 A | 1/1982 | Gaul, Jr. |
| 4,328,262 A | 5/1982 | Kurahashi et al. |
| 4,348,471 A | 9/1982 | Shelnut et al. |
| 4,349,609 A | 9/1982 | Takeda et al. |
| 4,362,809 A | 12/1982 | Chen et al. |
| 4,363,859 A | 12/1982 | Sasaki et al. |
| 4,369,284 A | 1/1983 | Chen |
| 4,399,255 A | 8/1983 | Smith et al. |
| 4,399,266 A | 8/1983 | Matsumura et al. |
| 4,413,052 A | 11/1983 | Green et al. |
| 4,413,088 A | 11/1983 | Frye |
| 4,419,437 A | 12/1983 | Noonan et al. |
| 4,423,135 A | 12/1983 | Chen et al. |
| 4,430,153 A | 2/1984 | Gleason et al. |
| 4,434,127 A | 2/1984 | Baile et al. |
| 4,442,197 A | 4/1984 | Crivello et al. |
| 4,456,679 A | 6/1984 | Leyrer et al. |
| 4,483,107 A | 11/1984 | Tomoyori et al. |
| 4,510,283 A | 4/1985 | Takeda et al. |
| 4,513,132 A | 4/1985 | Shoji et al. |
| 4,515,828 A | 5/1985 | Economy et al. |
| 4,557,996 A | 12/1985 | Aoyama et al. |
| 4,563,241 A | 1/1986 | Tanaka et al. |
| 4,587,138 A | 5/1986 | Yau et al. |
| 4,594,309 A | 6/1986 | Guillet |
| 4,595,599 A | 6/1986 | Brown et al. |
| 4,600,685 A | 7/1986 | Kitakohji et al. |
| 4,603,168 A | 7/1986 | Sasaki et al. |
| 4,609,614 A | 9/1986 | Pampalone et al. |
| 4,617,252 A | 10/1986 | Cordes, III et al. |
| 4,618,213 A | 10/1986 | Chen |
| 4,620,986 A | 11/1986 | Yau et al. |
| 4,624,912 A | 11/1986 | Zweifel et al. |
| 4,626,556 A | 12/1986 | Nozue et al. |
| 4,657,843 A | 4/1987 | Fukuyama et al. |
| 4,657,965 A | 4/1987 | Watanabe et al. |
| 4,663,414 A | 5/1987 | Estes et al. |
| 4,670,299 A | 6/1987 | Fukuyama et al. |
| 4,674,176 A | 6/1987 | Tuckerman |
| 4,676,867 A | 6/1987 | Elkins et al. |
| 4,678,835 A | 7/1987 | Chang et al. |
| 4,681,795 A | 7/1987 | Tuckerman |
| 4,687,216 A | 8/1987 | Kawamoto et al. |
| 4,693,959 A | 9/1987 | Ashcraft |
| 4,702,990 A | 10/1987 | Tanaka et al. |
| 4,705,729 A | 11/1987 | Sheats |
| 4,705,739 A | 11/1987 | Fisch |
| 4,708,925 A | 11/1987 | Newman |
| 4,723,978 A | 2/1988 | Clodgo et al. |
| 4,731,264 A | 3/1988 | Lin et al. |
| 4,732,858 A | 3/1988 | Brewer et al. |
| 4,745,169 A | 5/1988 | Sugiyama et al. |
| 4,746,693 A | 5/1988 | Meder |
| 4,752,649 A | 6/1988 | Neckers |
| 4,753,855 A | 6/1988 | Haluska et al. |
| 4,756,977 A | 7/1988 | Haluska et al. |
| 4,762,767 A | 8/1988 | Haas et al. |
| 4,763,966 A | 8/1988 | Suzuki et al. |
| 4,767,571 A | 8/1988 | Suzuki et al. |
| 4,774,141 A | 9/1988 | Matsui et al. |
| 4,778,624 A | 10/1988 | Ohashi et al. |
| 4,782,009 A | 11/1988 | Bolon et al. |
| 4,783,347 A | 11/1988 | Doin et al. |
| 4,806,504 A | 2/1989 | Cleeves |
| 4,808,653 A | 2/1989 | Haluska et al. |
| 4,814,578 A | 3/1989 | Tuckerman |
| 4,816,049 A | 3/1989 | Hata et al. |
| 4,822,697 A | 4/1989 | Haluska et al. |
| 4,822,718 A | 4/1989 | Latham et al. |
| 4,826,943 A | 5/1989 | Ito et al. |
| 4,831,188 A | 5/1989 | Neckers |
| 4,839,274 A | 6/1989 | Logan |
| 4,847,152 A | 7/1989 | Jabs et al. |
| 4,847,162 A | 7/1989 | Haluska et al. |
| 4,849,296 A | 7/1989 | Haluska et al. |
| 4,855,199 A | 8/1989 | Bolon et al. |
| 4,863,827 A | 9/1989 | Jain et al. |
| 4,863,829 A | 9/1989 | Furuta et al. |
| 4,863,833 A | 9/1989 | Fukuyama et al. |
| 4,876,165 A | 10/1989 | Brewer et al. |
| 4,885,262 A | 12/1989 | Ting et al. |
| 4,895,914 A | 1/1990 | Saitoh et al. |
| 4,898,907 A | 2/1990 | Haluska et al. |
| 4,904,721 A | 2/1990 | Hanaoka et al. |
| 4,910,122 A | 3/1990 | Arnold et al. |
| 4,911,992 A | 3/1990 | Haluska et al. |
| 4,913,846 A | 4/1990 | Suzuki et al. |
| 4,921,317 A | 5/1990 | Suzuki et al. |
| 4,921,778 A | 5/1990 | Thackeray et al. |
| 4,923,638 A | 5/1990 | Ohno et al. |
| 4,925,772 A | 5/1990 | Quella et al. |
| 4,926,383 A | 5/1990 | Kertis et al. |
| 4,927,732 A | 5/1990 | Merrem et al. |
| 4,935,320 A | 6/1990 | Rohde et al. |
| 4,935,583 A | 6/1990 | Kyle |
| 4,940,651 A | 7/1990 | Brown et al. |
| 4,942,083 A | 7/1990 | Smith, Jr. |
| 4,943,511 A | 7/1990 | Lazarus et al. |
| 4,950,577 A | 8/1990 | Grieve et al. |
| 4,950,583 A | 8/1990 | Brewer et al. |
| 4,954,414 A | 9/1990 | Adair et al. |
| 4,962,996 A | 10/1990 | Cuellar et al. |
| 4,970,134 A | 11/1990 | Bronstert et al. |
| 4,973,510 A | 11/1990 | Tanaka |
| 4,973,526 A | 11/1990 | Haluska |
| 4,981,530 A | 1/1991 | Clodgo et al. |
| 4,981,778 A | 1/1991 | Brault |
| 4,988,514 A | 1/1991 | Fukuyama et al. |
| 4,999,397 A | 3/1991 | Weiss et al. |
| 5,004,660 A | 4/1991 | Van Andel et al. |
| 5,008,320 A | 4/1991 | Haluska et al. |
| 5,009,669 A | 4/1991 | Jollenbeck et al. |
| 5,009,809 A | 4/1991 | Kosin et al. |
| 5,009,810 A | 4/1991 | Wason et al. |
| 5,013,608 A | 5/1991 | Guest et al. |
| 5,024,923 A | 6/1991 | Suzuki et al. |
| 5,026,624 A | 6/1991 | Day et al. |
| 5,034,189 A | 7/1991 | Cox et al. |
| 5,037,580 A | 8/1991 | Garcia et al. |
| 5,043,789 A | 8/1991 | Linde et al. |
| 5,045,570 A | 9/1991 | Mooney et al. |
| 5,045,592 A | 9/1991 | Weiss et al. |
| 5,049,414 A | 9/1991 | Kato |
| 5,055,372 A | 10/1991 | Shanklin et al. |
| 5,055,376 A | 10/1991 | Saeva |
| 5,059,448 A | 10/1991 | Chandra et al. |
| 5,059,500 A | 10/1991 | Needham et al. |
| 5,063,134 A | 11/1991 | Horiguchi et al. |
| 5,063,267 A | 11/1991 | Hanneman et al. |
| 5,077,085 A | 12/1991 | Schnur et al. |
| 5,079,600 A | 1/1992 | Schnur et al. |
| 5,100,503 A | 3/1992 | Allman et al. |
| 5,102,695 A | 4/1992 | Guest et al. |

(56) References Cited

U.S. PATENT DOCUMENTS

| | | | |
|---|---|---|---|
| 5,104,692 | A | 4/1992 | Belmares |
| 5,106,534 | A | 4/1992 | Wason et al. |
| 5,112,728 | A | 5/1992 | Tanji et al. |
| 5,116,637 | A | 5/1992 | Baney et al. |
| 5,116,715 | A | 5/1992 | Roland et al. |
| 5,126,289 | A | 6/1992 | Ziger |
| 5,137,655 | A | 8/1992 | Kosin et al. |
| 5,140,396 | A | 8/1992 | Needham et al. |
| 5,152,834 | A | 10/1992 | Allman |
| 5,153,254 | A | 10/1992 | Chen |
| 5,166,093 | A | 11/1992 | Grief |
| 5,173,368 | A | 12/1992 | Belmares |
| 5,179,185 | A | 1/1993 | Yamamoto et al. |
| 5,194,364 | A | 3/1993 | Abe et al. |
| 5,199,979 | A | 4/1993 | Lin et al. |
| 5,212,046 | A | 5/1993 | Lamola et al. |
| 5,212,218 | A | 5/1993 | Rinehart |
| 5,219,788 | A | 6/1993 | Abernathey et al. |
| 5,227,334 | A | 7/1993 | Sandhu |
| 5,236,984 | A | 8/1993 | Yamamoto et al. |
| 5,239,723 | A | 8/1993 | Chen |
| 5,250,224 | A | 10/1993 | Wason et al. |
| 5,252,340 | A | 10/1993 | Honeycutt |
| 5,252,618 | A | 10/1993 | Garcia et al. |
| 5,256,510 | A | 10/1993 | Bugner et al. |
| 5,262,201 | A | 11/1993 | Chandra et al. |
| 5,262,468 | A | 11/1993 | Chen |
| 5,272,026 | A | 12/1993 | Roland et al. |
| 5,272,042 | A | 12/1993 | Allen et al. |
| 5,278,010 | A | 1/1994 | Day et al. |
| 5,300,402 | A | 4/1994 | Card, Jr. et al. |
| 5,302,198 | A | 4/1994 | Allman |
| 5,302,455 | A | 4/1994 | Wason et al. |
| 5,302,849 | A | 4/1994 | Cavasin |
| 5,317,044 | A | 5/1994 | Mooney et al. |
| 5,320,868 | A | 6/1994 | Ballance et al. |
| 5,324,222 | A | 6/1994 | Chen |
| 5,324,591 | A | 6/1994 | Georger, Jr. et al. |
| 5,328,975 | A | 7/1994 | Hanson et al. |
| 5,334,646 | A | 8/1994 | Chen |
| 5,336,708 | A | 8/1994 | Chen |
| 5,339,197 | A | 8/1994 | Yen |
| 5,340,644 | A | 8/1994 | Babcock et al. |
| 5,359,022 | A | 10/1994 | Mautner et al. |
| 5,360,692 | A | 11/1994 | Kawabe et al. |
| 5,380,621 | A | 1/1995 | Dichiara et al. |
| 5,382,615 | A | 1/1995 | Godfrey |
| 5,384,357 | A | 1/1995 | Levinson et al. |
| 5,387,480 | A | 2/1995 | Haluska et al. |
| 5,389,496 | A | 2/1995 | Calvert et al. |
| 5,391,463 | A | 2/1995 | Ligler et al. |
| 5,394,269 | A * | 2/1995 | Takamatsu et al. ............ 359/580 |
| 5,395,734 | A | 3/1995 | Vogel et al. |
| 5,396,311 | A | 3/1995 | Fukushima et al. |
| 5,401,614 | A | 3/1995 | Dichiara et al. |
| 5,403,680 | A | 4/1995 | Otagawa et al. |
| 5,414,069 | A | 5/1995 | Cumming et al. |
| 5,417,977 | A | 5/1995 | Honeycutt |
| 5,418,136 | A | 5/1995 | Miller et al. |
| 5,432,007 | A | 7/1995 | Naito |
| 5,439,766 | A | 8/1995 | Day et al. |
| 5,439,872 | A | 8/1995 | Ito et al. |
| 5,441,765 | A | 8/1995 | Ballance et al. |
| 5,449,639 | A | 9/1995 | Wei et al. |
| 5,449,712 | A | 9/1995 | Gierke et al. |
| 5,455,145 | A | 10/1995 | Tarumoto |
| 5,455,208 | A | 10/1995 | Leung et al. |
| 5,457,081 | A | 10/1995 | Takiguchi et al. |
| 5,458,982 | A | 10/1995 | Godfrey |
| 5,467,626 | A | 11/1995 | Sanders |
| 5,468,591 | A | 11/1995 | Pearce et al. |
| 5,472,488 | A | 12/1995 | Allman |
| 5,475,890 | A | 12/1995 | Chen |
| 5,482,817 | A | 1/1996 | Dichiara et al. |
| 5,498,345 | A | 3/1996 | Jollenbeck et al. |
| 5,498,468 | A | 3/1996 | Blaney |
| 5,498,748 | A | 3/1996 | Urano et al. |
| 5,500,315 | A | 3/1996 | Calvert et al. |
| 5,508,334 | A | 4/1996 | Chen |
| 5,510,628 | A | 4/1996 | Georger, Jr. et al. |
| 5,512,418 | A | 4/1996 | Ma |
| 5,518,818 | A | 5/1996 | Kidai et al. |
| 5,520,855 | A | 5/1996 | Ito et al. |
| 5,523,163 | A | 6/1996 | Ballance et al. |
| 5,527,562 | A | 6/1996 | Balaba et al. |
| 5,527,872 | A | 6/1996 | Allman |
| 5,546,017 | A | 8/1996 | Vitunic |
| 5,552,260 | A | 9/1996 | Vogel et al. |
| 5,554,485 | A | 9/1996 | Dichiara et al. |
| 5,576,144 | A | 11/1996 | Pearce et al. |
| 5,576,247 | A | 11/1996 | Yano et al. |
| 5,576,359 | A | 11/1996 | Urano et al. |
| 5,578,318 | A | 11/1996 | Honeycutt |
| 5,580,606 | A | 12/1996 | Kai |
| 5,580,819 | A | 12/1996 | Li et al. |
| 5,583,195 | A | 12/1996 | Eckberg |
| 5,597,408 | A | 1/1997 | Choi |
| 5,624,294 | A | 4/1997 | Chen |
| 5,629,437 | A | 5/1997 | Linder et al. |
| 5,633,286 | A | 5/1997 | Chen |
| 5,635,240 | A | 6/1997 | Haluska et al. |
| 5,638,724 | A | 6/1997 | Sanders |
| 5,648,201 | A | 7/1997 | Dulcey et al. |
| 5,655,947 | A | 8/1997 | Chen |
| 5,661,196 | A | 8/1997 | Mayer et al. |
| 5,661,992 | A | 9/1997 | Sanders |
| 5,662,109 | A | 9/1997 | Hutson |
| 5,663,286 | A | 9/1997 | Ahmed et al. |
| 5,665,845 | A | 9/1997 | Allman |
| 5,670,295 | A | 9/1997 | Namba et al. |
| 5,672,243 | A | 9/1997 | Hsia et al. |
| 5,674,624 | A | 10/1997 | Miyazaki et al. |
| 5,674,648 | A | 10/1997 | Brewer et al. |
| 5,677,112 | A | 10/1997 | Urano et al. |
| 5,679,128 | A | 10/1997 | Latting et al. |
| 5,683,095 | A | 11/1997 | Haluska et al. |
| 5,693,691 | A | 12/1997 | Flaim et al. |
| 5,693,701 | A | 12/1997 | Camilletti et al. |
| 5,695,551 | A | 12/1997 | Buckingham et al. |
| 5,695,910 | A | 12/1997 | Urano et al. |
| 5,707,883 | A | 1/1998 | Tabara |
| 5,719,249 | A | 2/1998 | Fujita et al. |
| 5,729,563 | A | 3/1998 | Wang et al. |
| 5,731,091 | A | 3/1998 | Schmidt et al. |
| 5,741,623 | A | 4/1998 | Namba et al. |
| 5,744,243 | A | 4/1998 | Li et al. |
| 5,744,244 | A | 4/1998 | Camilletti et al. |
| 5,747,223 | A | 5/1998 | Allen et al. |
| 5,747,553 | A | 5/1998 | Guzauskas |
| 5,750,292 | A | 5/1998 | Sato et al. |
| 5,755,867 | A | 5/1998 | Chikuni et al. |
| 5,756,257 | A | 5/1998 | Landgrebe et al. |
| 5,759,625 | A | 6/1998 | Laubacher et al. |
| 5,760,117 | A | 6/1998 | Chen |
| 5,767,014 | A | 6/1998 | Hawker et al. |
| 5,773,170 | A | 6/1998 | Patel et al. |
| 5,776,559 | A | 7/1998 | Woolford |
| 5,780,206 | A | 7/1998 | Urano et al. |
| 5,786,125 | A | 7/1998 | Tsuchiya et al. |
| 5,800,926 | A | 9/1998 | Nogami et al. |
| 5,840,821 | A | 11/1998 | Nakano et al. |
| 5,843,617 | A | 12/1998 | Patel et al. |
| 5,851,730 | A | 12/1998 | Thackeray et al. |
| 5,851,738 | A | 12/1998 | Thackeray et al. |
| 5,853,808 | A | 12/1998 | Arkles et al. |
| 5,855,960 | A | 1/1999 | Ohnishi et al. |
| 5,858,547 | A | 1/1999 | Drage |
| 5,868,597 | A | 2/1999 | Chen |
| 5,873,931 | A | 2/1999 | Scholz et al. |
| 5,877,228 | A | 3/1999 | Mine et al. |
| 5,883,011 | A | 3/1999 | Lin et al. |
| 5,884,639 | A | 3/1999 | Chen |
| 5,905,109 | A | 5/1999 | Shimizu et al. |
| 5,910,021 | A | 6/1999 | Tabara |

(56) References Cited

U.S. PATENT DOCUMENTS

| | | |
|---|---|---|
| 5,922,299 A | 7/1999 | Bruinsma et al. |
| 5,929,159 A | 7/1999 | Schutt et al. |
| 5,935,758 A | 8/1999 | Patel et al. |
| 5,938,499 A | 8/1999 | Chen |
| 5,939,236 A | 8/1999 | Pavelchek et al. |
| 5,939,510 A | 8/1999 | Sato et al. |
| 5,945,172 A | 8/1999 | Yamaya et al. |
| 5,945,249 A | 8/1999 | Patel et al. |
| 5,948,600 A | 9/1999 | Roschger et al. |
| 5,949,518 A | 9/1999 | Belmares et al. |
| 5,953,627 A | 9/1999 | Carter et al. |
| 5,962,067 A | 10/1999 | Bautista et al. |
| 5,962,572 A | 10/1999 | Chen |
| 5,964,917 A | 10/1999 | Latting |
| 5,965,305 A | 10/1999 | Ligler et al. |
| 5,972,616 A | 10/1999 | O'Brien et al. |
| 5,976,666 A | 11/1999 | Narang et al. |
| 5,981,675 A | 11/1999 | Valint, Jr. et al. |
| 5,985,444 A | 11/1999 | Olson et al. |
| 5,986,344 A | 11/1999 | Subramanion et al. |
| 5,994,431 A | 11/1999 | Olson et al. |
| 5,997,621 A | 12/1999 | Scholz et al. |
| 5,998,300 A | 12/1999 | Tabara |
| 5,998,522 A | 12/1999 | Nakano et al. |
| 6,008,350 A | 12/1999 | Roschger et al. |
| 6,020,410 A | 2/2000 | Hacker et al. |
| 6,022,812 A | 2/2000 | Smith et al. |
| 6,025,077 A | 2/2000 | Yamaki et al. |
| 6,033,283 A | 3/2000 | Chen |
| 6,037,275 A | 3/2000 | Wu et al. |
| 6,040,053 A | 3/2000 | Scholz et al. |
| 6,040,251 A | 3/2000 | Caldwell |
| 6,042,994 A | 3/2000 | Yang et al. |
| 6,043,547 A | 3/2000 | Hsia et al. |
| 6,048,804 A | 4/2000 | Smith et al. |
| 6,050,871 A | 4/2000 | Chen |
| 6,051,310 A | 4/2000 | Cano et al. |
| 6,057,239 A | 5/2000 | Wang et al. |
| 6,072,018 A | 6/2000 | Wilkes et al. |
| 6,074,695 A | 6/2000 | Kobayashi et al. |
| 6,087,068 A | 7/2000 | Sato et al. |
| 6,090,448 A | 7/2000 | Wallace et al. |
| 6,096,460 A | 8/2000 | French et al. |
| 6,103,456 A | 8/2000 | Tobben et al. |
| 6,103,779 A | 8/2000 | Guzauskas |
| 6,103,790 A | 8/2000 | Cavaille et al. |
| 6,107,167 A | 8/2000 | Bhakta |
| 6,117,176 A | 9/2000 | Chen |
| 6,124,369 A | 9/2000 | Kudo et al. |
| 6,126,733 A | 10/2000 | Wallace et al. |
| 6,137,175 A | 10/2000 | Tabara |
| 6,140,254 A | 10/2000 | Endisch et al. |
| 6,143,855 A | 11/2000 | Hacker et al. |
| 6,144,083 A | 11/2000 | Yin |
| 6,147,407 A | 11/2000 | Jin et al. |
| 6,148,830 A | 11/2000 | Chen |
| 6,149,934 A | 11/2000 | Krzysik et al. |
| 6,149,966 A | 11/2000 | Kobayashi et al. |
| 6,150,250 A | 11/2000 | Tabara et al. |
| 6,150,440 A | 11/2000 | Olson et al. |
| 6,152,906 A | 11/2000 | Faulks et al. |
| 6,161,555 A | 12/2000 | Chen |
| 6,165,697 A | 12/2000 | Thackaray et al. |
| 6,166,163 A | 12/2000 | Kudo et al. |
| 6,171,766 B1 | 1/2001 | Patel et al. |
| 6,174,631 B1 | 1/2001 | French et al. |
| 6,174,977 B1 | 1/2001 | Ariyoshi et al. |
| 6,177,131 B1 | 1/2001 | Glaubitt et al. |
| 6,177,199 B1 | 1/2001 | Hacker et al. |
| 6,177,360 B1 | 1/2001 | Carter et al. |
| 6,180,025 B1 | 1/2001 | Schoenfeld et al. |
| 6,180,317 B1 | 1/2001 | Allen et al. |
| 6,187,505 B1 | 2/2001 | Lin et al. |
| 6,187,689 B1 | 2/2001 | Tabara |
| 6,190,830 B1 | 2/2001 | Leon et al. |
| 6,190,839 B1 | 2/2001 | Pavelchek et al. |
| 6,190,955 B1 | 2/2001 | Ilg et al. |
| 6,191,030 B1 | 2/2001 | Subramanian et al. |
| 6,194,121 B1 | 2/2001 | Namba et al. |
| 6,194,534 B1 | 2/2001 | Baumann et al. |
| 6,204,202 B1 | 3/2001 | Leung et al. |
| 6,208,041 B1 | 3/2001 | Majumdar et al. |
| 6,210,862 B1 | 4/2001 | Day et al. |
| 6,214,104 B1 | 4/2001 | Iida et al. |
| 6,217,890 B1 | 4/2001 | Paul et al. |
| 6,218,020 B1 | 4/2001 | Hacker et al. |
| 6,218,497 B1 | 4/2001 | Hacker et al. |
| 6,225,033 B1 | 5/2001 | Onishi et al. |
| 6,225,671 B1 | 5/2001 | Yin |
| 6,231,989 B1 | 5/2001 | Chung et al. |
| 6,232,424 B1 | 5/2001 | Zhong et al. |
| 6,235,456 B1 | 5/2001 | Ibok |
| 6,238,379 B1 | 5/2001 | Keuhn, Jr. et al. |
| 6,238,838 B1 | 5/2001 | Gaschler et al. |
| 6,251,486 B1 | 6/2001 | Chandross et al. |
| 6,255,671 B1 | 7/2001 | Bojarczuk, Jr. et al. |
| 6,261,676 B1 | 7/2001 | Olson et al. |
| 6,261,743 B1 | 7/2001 | Pavelchek et al. |
| 6,268,108 B1 | 7/2001 | Iguchi et al. |
| 6,268,294 B1 | 7/2001 | Jang et al. |
| 6,268,457 B1 | 7/2001 | Kennedy et al. |
| 6,271,273 B1 | 8/2001 | You et al. |
| 6,277,750 B1 | 8/2001 | Pawlowski et al. |
| 6,280,911 B1 | 8/2001 | Trefonas, III |
| 6,284,428 B1 | 9/2001 | Hirosaki et al. |
| 6,287,286 B1 | 9/2001 | Akin et al. |
| 6,291,143 B1 | 9/2001 | Patel et al. |
| 6,291,586 B2 | 9/2001 | Lasch et al. |
| 6,296,862 B1 | 10/2001 | Paul et al. |
| 6,306,736 B1 | 10/2001 | Alivisatos et al. |
| 6,313,045 B1 | 11/2001 | Zhong et al. |
| 6,313,257 B1 | 11/2001 | Abbey |
| 6,315,946 B1 | 11/2001 | Focht |
| 6,316,013 B1 | 11/2001 | Paul et al. |
| 6,316,160 B1 | 11/2001 | Shao et al. |
| 6,316,165 B1 | 11/2001 | Pavelchek et al. |
| 6,318,124 B1 | 11/2001 | Rutherford et al. |
| 6,319,855 B1 | 11/2001 | Hendricks et al. |
| 6,323,268 B1 | 11/2001 | Fisher et al. |
| 6,324,703 B1 | 12/2001 | Chen |
| 6,326,231 B1 | 12/2001 | Subramanian et al. |
| 6,329,117 B1 | 12/2001 | Padmanaban et al. |
| 6,329,118 B1 | 12/2001 | Hussein et al. |
| 6,333,374 B1 | 12/2001 | Chen |
| 6,335,234 B2 | 1/2002 | Wu et al. |
| 6,335,235 B1 | 1/2002 | Bhakta et al. |
| 6,337,089 B1 | 1/2002 | Yoshioka et al. |
| 6,340,735 B1 | 1/2002 | Yagihashi |
| 6,342,249 B1 | 1/2002 | Wong et al. |
| 6,344,284 B1 | 2/2002 | Chou |
| 6,344,305 B1 | 2/2002 | Lin et al. |
| 6,348,240 B1 | 2/2002 | Calvert et al. |
| 6,350,818 B1 | 2/2002 | Hong et al. |
| 6,352,931 B1 | 3/2002 | Seta et al. |
| 6,358,294 B1 | 3/2002 | Latting |
| 6,358,559 B1 | 3/2002 | Hacker et al. |
| 6,359,096 B1 | 3/2002 | Hacker et al. |
| 6,359,099 B1 | 3/2002 | Hacker et al. |
| 6,361,820 B1 | 3/2002 | Hacker et al. |
| 6,365,266 B1 | 4/2002 | MacDougall et al. |
| 6,365,529 B1 | 4/2002 | Hussein et al. |
| 6,365,765 B1 | 4/2002 | Baldwin et al. |
| 6,368,400 B1 | 4/2002 | Baldwin et al. |
| 6,368,681 B1 | 4/2002 | Ogawa |
| 6,374,738 B1 | 4/2002 | Lewis et al. |
| 6,380,621 B1 | 4/2002 | Ando et al. |
| 6,383,466 B1 | 5/2002 | Domansky et al. |
| 6,387,519 B1 | 5/2002 | Anderson et al. |
| 6,391,524 B2 | 5/2002 | Yates et al. |
| 6,399,269 B2 | 6/2002 | Mizutani et al. |
| 6,403,464 B1 | 6/2002 | Chang |
| 6,409,883 B1 | 6/2002 | Makolin et al. |
| 6,410,150 B1 | 6/2002 | Kurosawa et al. |
| 6,410,209 B1 | 6/2002 | Adams et al. |

(56) References Cited

U.S. PATENT DOCUMENTS

| | | | |
|---|---|---|---|
| 6,413,647 B1 | 7/2002 | Hayashi et al. |
| 6,420,088 B1 | 7/2002 | Angelopoulos et al. |
| 6,420,475 B1 | 7/2002 | Chen |
| 6,426,125 B1 | 7/2002 | Yang et al. |
| 6,432,191 B2 | 8/2002 | Schutt |
| 6,433,037 B1 | 8/2002 | Guzauskas |
| 6,441,452 B2 | 8/2002 | Yin |
| 6,444,584 B1 | 9/2002 | Hsiao |
| 6,448,185 B1 | 9/2002 | Andideh et al. |
| 6,448,331 B1 | 9/2002 | Ioka et al. |
| 6,448,464 B1 | 9/2002 | Akin et al. |
| 6,451,503 B1 | 9/2002 | Thackeray et al. |
| 6,455,207 B1 | 9/2002 | Katch et al. |
| 6,455,416 B1 | 9/2002 | Subramanian et al. |
| 6,461,970 B1 | 10/2002 | Yin |
| 6,465,358 B1 | 10/2002 | Nashner et al. |
| 6,465,889 B1 | 10/2002 | Subramanian et al. |
| 6,472,012 B2 | 10/2002 | Nakada et al. |
| 6,472,128 B2 | 10/2002 | Thackeray et al. |
| 6,475,892 B1 | 11/2002 | Bhakta |
| 6,485,368 B2 | 11/2002 | Jones et al. |
| 6,488,394 B1 | 12/2002 | Mabe et al. |
| 6,491,840 B1 | 12/2002 | Frankenbach et al. |
| 6,492,441 B2 | 12/2002 | Hong et al. |
| 6,495,264 B2 | 12/2002 | Hayashi et al. |
| 6,495,479 B1 | 12/2002 | Wu et al. |
| 6,497,893 B1 | 12/2002 | Everhart et al. |
| 6,503,233 B1 | 1/2003 | Chen et al. |
| 6,503,413 B2 | 1/2003 | Uchiyama et al. |
| 6,503,525 B1 | 1/2003 | Mayberry et al. |
| 6,503,526 B1 | 1/2003 | Krzysik et al. |
| 6,503,586 B1 | 1/2003 | Wu et al. |
| 6,503,692 B2 | 1/2003 | Angelopoulos et al. |
| 6,503,850 B1 | 1/2003 | Wallace et al. |
| 6,505,362 B1 | 1/2003 | Scipio |
| 6,506,497 B1 | 1/2003 | Kennedy et al. |
| 6,509,279 B2 | 1/2003 | Fujii et al. |
| 6,512,071 B1 | 1/2003 | Hacker et al. |
| 6,514,677 B1 | 2/2003 | Ramsden et al. |
| 6,515,073 B2 | 2/2003 | Sakamoto et al. |
| 6,517,951 B1 | 2/2003 | Hacker et al. |
| 6,528,235 B2 | 3/2003 | Thackeray et al. |
| 6,540,884 B1 | 4/2003 | Siddle et al. |
| 6,541,107 B1 | 4/2003 | Zhong et al. |
| 6,544,717 B2 | 4/2003 | Hirosaki et al. |
| 6,548,113 B1 | 4/2003 | Birnbaum et al. |
| 6,552,109 B1 | 4/2003 | Chen |
| 6,558,363 B2 | 5/2003 | McDowall et al. |
| 6,558,880 B1 | 5/2003 | Goswami et al. |
| 6,562,192 B1 | 5/2003 | Hamilton et al. |
| 6,565,813 B1 | 5/2003 | Garyantes |
| 6,566,479 B1 | 5/2003 | Bublewitz et al. |
| 6,573,175 B1 | 6/2003 | Yin et al. |
| 6,576,382 B2 | 6/2003 | Day et al. |
| 6,576,408 B2 | 6/2003 | Meador et al. |
| 6,576,651 B2 | 6/2003 | Bandyopadhyay et al. |
| 6,582,861 B2 | 6/2003 | Buxbaum et al. |
| 6,583,071 B1 * | 6/2003 | Weidman et al. ............ 438/787 |
| 6,586,102 B1 | 7/2003 | Stachowiak |
| 6,589,658 B1 | 7/2003 | Stachowiak |
| 6,592,980 B1 | 7/2003 | MacDougall et al. |
| 6,592,999 B1 | 7/2003 | Anderson et al. |
| 6,593,388 B2 | 7/2003 | Crivello |
| 6,596,314 B2 | 7/2003 | Wong et al. |
| 6,596,404 B1 | 7/2003 | Albaugh et al. |
| 6,596,467 B2 | 7/2003 | Gallagher et al. |
| 6,602,652 B2 | 8/2003 | Adams et al. |
| 6,605,359 B2 | 8/2003 | Robinson et al. |
| 6,605,360 B2 | 8/2003 | Kizaki et al. |
| 6,605,362 B2 | 8/2003 | Baldwin et al. |
| 6,605,542 B2 | 8/2003 | Seta et al. |
| 6,607,991 B1 | 8/2003 | Livesay et al. |
| 6,610,457 B2 | 8/2003 | Kim et al. |
| 6,612,828 B2 | 9/2003 | Powers et al. |
| 6,613,834 B2 | 9/2003 | Nakata et al. |
| 6,617,257 B2 | 9/2003 | Ni et al. |
| 6,617,609 B2 | 9/2003 | Kelley et al. |
| 6,623,791 B2 | 9/2003 | Sadvary et al. |
| 6,627,275 B1 | 9/2003 | Chen |
| 6,632,535 B1 | 10/2003 | Buazza et al. |
| 6,635,281 B2 | 10/2003 | Wong et al. |
| 6,635,341 B1 | 10/2003 | Barancyk et al. |
| 6,645,685 B2 | 11/2003 | Takata et al. |
| 6,645,881 B2 | 11/2003 | Yamada et al. |
| 6,649,212 B2 | 11/2003 | Payne et al. |
| 6,649,534 B2 | 11/2003 | Fujii et al. |
| 6,649,741 B1 | 11/2003 | O'Brien et al. |
| 6,652,766 B1 | 11/2003 | Frankenbach et al. |
| 6,653,049 B2 | 11/2003 | Pavelchek et al. |
| 6,655,946 B2 | 12/2003 | Foreman et al. |
| 6,664,199 B2 | 12/2003 | Fujii et al. |
| 6,667,424 B1 | 12/2003 | Hamilton et al. |
| 6,670,284 B2 | 12/2003 | Yin |
| 6,673,982 B1 | 1/2004 | Chen et al. |
| 6,674,106 B2 | 1/2004 | Tanaka et al. |
| 6,676,398 B2 | 1/2004 | Foreman et al. |
| 6,676,740 B2 | 1/2004 | Matsumura et al. |
| 6,677,392 B2 | 1/2004 | Ravichandran et al. |
| 6,689,932 B2 | 2/2004 | Kruchoski et al. |
| 6,696,538 B2 | 2/2004 | Ko et al. |
| 6,699,647 B2 | 3/2004 | Lynch et al. |
| 6,702,564 B2 | 3/2004 | Foreman et al. |
| 6,703,169 B2 | 3/2004 | Fuller et al. |
| 6,703,462 B2 | 3/2004 | Lee |
| 6,709,257 B2 | 3/2004 | Foreman et al. |
| 6,712,331 B2 | 3/2004 | Foreman et al. |
| 6,716,566 B2 | 4/2004 | Aoshima |
| 6,717,181 B2 | 4/2004 | Murakami et al. |
| 6,720,125 B2 | 4/2004 | Nakamura et al. |
| 6,726,463 B2 | 4/2004 | Foreman |
| 6,730,454 B2 | 5/2004 | Pfeiffer et al. |
| 6,730,461 B2 | 5/2004 | Hunt et al. |
| 6,737,121 B2 | 5/2004 | Yang et al. |
| 6,740,685 B2 | 5/2004 | Li et al. |
| 6,749,860 B2 | 6/2004 | Tyrrell et al. |
| 6,752,613 B2 | 6/2004 | Foreman |
| 6,756,103 B2 | 6/2004 | Thompson et al. |
| 6,756,124 B2 | 6/2004 | Kanamori et al. |
| 6,756,520 B1 | 6/2004 | Krzysik et al. |
| 6,758,663 B2 | 7/2004 | Foreman et al. |
| 6,767,689 B2 | 7/2004 | Pavelchek et al. |
| 6,770,726 B1 | 8/2004 | Arkles et al. |
| 6,773,861 B2 | 8/2004 | Takashima et al. |
| 6,773,864 B1 | 8/2004 | Thackeray et al. |
| 6,776,094 B1 | 8/2004 | Whitesides et al. |
| 6,777,092 B1 | 8/2004 | Hayashi et al. |
| 6,780,498 B2 | 8/2004 | Nakata et al. |
| 6,783,468 B2 | 8/2004 | Sullivan et al. |
| 6,787,281 B2 | 9/2004 | Tao et al. |
| 6,790,024 B2 | 9/2004 | Foreman |
| 6,794,440 B2 | 9/2004 | Chen |
| 6,797,343 B2 | 9/2004 | Lee |
| 6,800,330 B2 | 10/2004 | Hayashi et al. |
| 6,803,034 B2 | 10/2004 | DuVal et al. |
| 6,803,168 B1 | 10/2004 | Padmanaban et al. |
| 6,803,476 B2 | 10/2004 | Rantala et al. |
| 6,808,381 B2 | 10/2004 | Foreman et al. |
| 6,818,289 B2 | 11/2004 | MacDougall et al. |
| 6,819,049 B1 | 11/2004 | Bohmer et al. |
| 6,824,879 B2 | 11/2004 | Baldwin et al. |
| 6,824,952 B1 | 11/2004 | Minsek et al. |
| 6,825,303 B2 | 11/2004 | Lee |
| 6,831,189 B2 | 12/2004 | Rantala et al. |
| 6,832,064 B2 | 12/2004 | Simpson et al. |
| 6,838,178 B1 | 1/2005 | Strickler et al. |
| 6,840,752 B2 | 1/2005 | Foreman et al. |
| 6,844,131 B2 | 1/2005 | Oberlander et al. |
| 6,846,614 B2 | 1/2005 | Timpe et al. |
| 6,849,209 B2 | 2/2005 | Minami et al. |
| 6,849,373 B2 | 2/2005 | Pavelchek et al. |
| 6,849,923 B2 | 2/2005 | Seta et al. |
| 6,852,421 B2 | 2/2005 | Wayton et al. |
| 6,852,766 B1 | 2/2005 | De Voe |
| 6,855,466 B2 | 2/2005 | Pavelchek et al. |

(56) References Cited

U.S. PATENT DOCUMENTS

| | | | |
|---|---|---|---|
| 6,864,040 B2 | 3/2005 | Muller et al. |
| 6,867,253 B1 | 3/2005 | Chen |
| 6,869,747 B2 | 3/2005 | Sabnis et al. |
| 6,875,005 B2 | 4/2005 | Foreman |
| 6,875,262 B1 | 4/2005 | Shibuya et al. |
| 6,884,568 B2 | 4/2005 | Timpe et al. |
| 6,887,644 B1 | 5/2005 | Nozaki et al. |
| 6,887,648 B2 | 5/2005 | Pavelchek et al. |
| 6,888,174 B2 | 5/2005 | Hohn et al. |
| 6,890,448 B2 | 5/2005 | Pavelchek |
| 6,890,605 B2 | 5/2005 | Nishikawa et al. |
| 6,890,855 B2 | 5/2005 | Cotte et al. |
| 6,890,865 B2 | 5/2005 | Yin et al. |
| 6,891,237 B1 | 5/2005 | Bao et al. |
| 6,893,245 B2 | 5/2005 | Foreman et al. |
| 6,893,797 B2 | 5/2005 | Munnelly et al. |
| 6,896,821 B2 | 5/2005 | Louellet |
| 6,896,955 B2 | 5/2005 | Mandal et al. |
| 6,899,988 B2 | 5/2005 | Kidnie et al. |
| 6,900,000 B2 | 5/2005 | Sabnis et al. |
| 6,902,771 B2 | 6/2005 | Shiota et al. |
| 6,902,861 B2 | 6/2005 | Tao et al. |
| 6,908,722 B2 | 6/2005 | Ebata et al. |
| 6,909,220 B2 | 6/2005 | Chen |
| 6,911,514 B2 | 6/2005 | Bublewitz et al. |
| 6,914,114 B2 | 7/2005 | Baldwin et al. |
| 6,921,578 B2 | 7/2005 | Tsujino et al. |
| 6,924,384 B2 | 8/2005 | Rantala et al. |
| 6,942,083 B2 | 9/2005 | Barnes et al. |
| 6,942,918 B2 | 9/2005 | MacDougall et al. |
| 6,956,097 B2 | 10/2005 | Kennedy et al. |
| 6,969,753 B2 | 11/2005 | Baldwin et al. |
| 6,974,970 B2 | 12/2005 | Rantala et al. |
| 7,011,889 B2 | 3/2006 | Bedwell et al. |
| 7,012,125 B2 | 3/2006 | Kennedy et al. |
| 7,014,982 B2 | 3/2006 | Thackeray et al. |
| 7,015,061 B2 | 3/2006 | Lu et al. |
| 7,026,053 B2 | 4/2006 | Shiota et al. |
| 7,026,427 B2 | 4/2006 | Koehler et al. |
| 7,060,634 B2 | 6/2006 | Rantala et al. |
| 7,074,874 B2 | 7/2006 | Kobayashi et al. |
| 7,081,272 B2 | 7/2006 | Sasaki et al. |
| 7,098,346 B2 | 8/2006 | Rantala et al. |
| 7,109,519 B2 | 9/2006 | Gerlach |
| 7,119,354 B2 | 10/2006 | Yagihashi et al. |
| 7,128,944 B2 | 10/2006 | Becker et al. |
| 7,128,976 B2 | 10/2006 | Hayashi et al. |
| 7,132,473 B2 | 11/2006 | Ogihara et al. |
| 7,135,064 B2 | 11/2006 | Shibuya et al. |
| 7,144,827 B2 | 12/2006 | Rantala et al. |
| 7,161,019 B2 | 1/2007 | Rantala et al. |
| 7,172,913 B2 | 2/2007 | Lee et al. |
| 7,173,371 B2 | 2/2007 | Pang et al. |
| 7,173,372 B2 | 2/2007 | Koo et al. |
| 7,176,493 B2 | 2/2007 | So et al. |
| 7,176,535 B2 | 2/2007 | Chae |
| 7,176,994 B2 | 2/2007 | Maeda et al. |
| 7,177,000 B2 | 2/2007 | Hu et al. |
| 7,179,673 B2 | 2/2007 | Song et al. |
| 7,180,090 B2 | 2/2007 | Chen et al. |
| 7,180,198 B2 | 2/2007 | Kim |
| 7,180,559 B2 | 2/2007 | Chang et al. |
| 7,180,563 B2 | 2/2007 | Kim |
| 7,180,565 B2 | 2/2007 | Hong et al. |
| 7,198,823 B2 | 4/2007 | Lee et al. |
| 7,239,018 B2* | 7/2007 | Hamada et al. ............... 257/758 |
| 7,244,960 B2 | 7/2007 | Spreitzer et al. |
| 7,297,464 B2 | 11/2007 | Sakurai et al. |
| 7,374,812 B2 | 5/2008 | Mizuno |
| 7,445,953 B2 | 11/2008 | Lu et al. |
| 7,575,809 B2 | 8/2009 | Glaubitt et al. |
| 7,678,462 B2 | 3/2010 | Kennedy et al. |
| 7,767,253 B2 | 8/2010 | Sharma |
| 7,931,940 B2* | 4/2011 | Suzuki et al. ............... 427/344 |
| 8,029,871 B2* | 10/2011 | Nakayama et al. ........... 427/515 |
| 2001/0024685 A1 | 9/2001 | Boulton et al. |
| 2002/0020327 A1 | 2/2002 | Hayashi et al. |
| 2002/0031729 A1 | 3/2002 | Trefonas, III et al. |
| 2002/0034626 A1 | 3/2002 | Liu |
| 2002/0034630 A1 | 3/2002 | Cano et al. |
| 2002/0068181 A1 | 6/2002 | Baldwin et al. |
| 2002/0074625 A1 | 6/2002 | Wang et al. |
| 2002/0090519 A1 | 7/2002 | Kursawe et al. |
| 2002/0095018 A1 | 7/2002 | Baldwin et al. |
| 2002/0102396 A1 | 8/2002 | MacDougall |
| 2002/0102417 A1 | 8/2002 | Schutt et al. |
| 2002/0123592 A1 | 9/2002 | Zhang et al. |
| 2002/0127330 A1 | 9/2002 | Jin et al. |
| 2002/0128388 A1 | 9/2002 | Kennedy et al. |
| 2002/0169269 A1 | 11/2002 | Hwang et al. |
| 2002/0192981 A1 | 12/2002 | Fujii et al. |
| 2003/0003176 A1 | 1/2003 | Foreman et al. |
| 2003/0091838 A1 | 5/2003 | Hayashi et al. |
| 2003/0104225 A1 | 6/2003 | Shiota et al. |
| 2003/0105246 A1 | 6/2003 | Andoh et al. |
| 2003/0111748 A1 | 6/2003 | Foreman |
| 2003/0120018 A1 | 6/2003 | Baldwin et al. |
| 2003/0125430 A1 | 7/2003 | Adedeji et al. |
| 2003/0157311 A1 | 8/2003 | MacDougall |
| 2003/0157340 A1 | 8/2003 | Shiota et al. |
| 2003/0157391 A1 | 8/2003 | Coleman et al. |
| 2003/0171729 A1 | 9/2003 | Kaun et al. |
| 2003/0191269 A1 | 10/2003 | Ko et al. |
| 2003/0192638 A1 | 10/2003 | Yang et al. |
| 2003/0193624 A1 | 10/2003 | Kobayashi et al. |
| 2003/0198578 A1 | 10/2003 | Lee et al. |
| 2003/0199633 A1 | 10/2003 | Leon et al. |
| 2003/0224156 A1* | 12/2003 | Kirner et al. ............... 428/312.2 |
| 2003/0224611 A1 | 12/2003 | Seta et al. |
| 2003/0227021 A1 | 12/2003 | Yamazaki et al. |
| 2004/0020689 A1 | 2/2004 | Kagami et al. |
| 2004/0028915 A1 | 2/2004 | Shibuya et al. |
| 2004/0028918 A1 | 2/2004 | Becker et al. |
| 2004/0067436 A1 | 4/2004 | Kinsho et al. |
| 2004/0067437 A1 | 4/2004 | Wayton et al. |
| 2004/0072420 A1 | 4/2004 | Enomoto et al. |
| 2004/0072436 A1 | 4/2004 | Ramachandra Rao et al. |
| 2004/0077757 A1 | 4/2004 | Araki et al. |
| 2004/0087184 A1 | 5/2004 | Mandal et al. |
| 2004/0089238 A1 | 5/2004 | Birnbaum |
| 2004/0091811 A1 | 5/2004 | Munnelly et al. |
| 2004/0096666 A1 | 5/2004 | Knox et al. |
| 2004/0122197 A1 | 6/2004 | Putzer |
| 2004/0131979 A1 | 7/2004 | Li et al. |
| 2004/0166434 A1 | 8/2004 | Dammel et al. |
| 2004/0180223 A1 | 9/2004 | Shibuya et al. |
| 2004/0201007 A1 | 10/2004 | Yagihashi et al. |
| 2004/0219372 A1 | 11/2004 | Ogihara et al. |
| 2004/0229158 A1 | 11/2004 | Meador et al. |
| 2004/0247900 A1 | 12/2004 | Ogihara et al. |
| 2004/0253461 A1 | 12/2004 | Ogihara et al. |
| 2004/0253532 A1 | 12/2004 | Wu et al. |
| 2004/0253535 A1 | 12/2004 | Cameron et al. |
| 2004/0258929 A1 | 12/2004 | Glaubitt et al. |
| 2005/0003681 A1 | 1/2005 | Lyu |
| 2005/0019842 A1 | 1/2005 | Prober et al. |
| 2005/0020837 A1 | 1/2005 | Doherty et al. |
| 2005/0026092 A1 | 2/2005 | Nagase |
| 2005/0031791 A1* | 2/2005 | Sasaki et al. ............... 427/372.2 |
| 2005/0032357 A1 | 2/2005 | Runtala et al. |
| 2005/0042538 A1 | 2/2005 | Babich et al. |
| 2005/0058929 A1 | 3/2005 | Kennedy et al. |
| 2005/0064726 A1 | 3/2005 | Reid et al. |
| 2005/0074689 A1 | 4/2005 | Angelopoulos et al. |
| 2005/0074981 A1 | 4/2005 | Meagley et al. |
| 2005/0077639 A1 | 4/2005 | Foreman et al. |
| 2005/0080214 A1 | 4/2005 | Shin et al. |
| 2005/0090570 A1 | 4/2005 | Lyu |
| 2005/0092206 A1 | 5/2005 | Sakamoto |
| 2005/0096408 A1 | 5/2005 | Wakamura |
| 2005/0106376 A1 | 5/2005 | Leung et al. |
| 2005/0119394 A1 | 6/2005 | Sakurai |
| 2005/0136268 A1 | 6/2005 | Shin et al. |
| 2005/0136687 A1 | 6/2005 | Lu et al. |

(56) References Cited

U.S. PATENT DOCUMENTS

| | | |
|---|---|---|
| 2005/0171277 A1 | 8/2005 | Li et al. |
| 2005/0221225 A1 | 10/2005 | Kawana |
| 2005/0234167 A1 | 10/2005 | Bae et al. |
| 2005/0245717 A1 | 11/2005 | Kennedy et al. |
| 2005/0255326 A1 | 11/2005 | Sakurai et al. |
| 2006/0027803 A1 | 2/2006 | Lu et al. |
| 2006/0046079 A1 | 3/2006 | Lee et al. |
| 2006/0047034 A1 | 3/2006 | Sakurai |
| 2006/0052566 A1 | 3/2006 | Sakurai et al. |
| 2006/0057801 A1 | 3/2006 | Runtala et al. |
| 2006/0110682 A1 | 5/2006 | Thackeray et al. |
| 2006/0127587 A1 | 6/2006 | Kang et al. |
| 2006/0131753 A1 | 6/2006 | Runtala et al. |
| 2006/0132459 A1 | 6/2006 | Huddleston et al. |
| 2006/0134441 A1 | 6/2006 | Mah et al. |
| 2006/0141163 A1 | 6/2006 | Choi et al. |
| 2006/0141641 A1 | 6/2006 | Fan et al. |
| 2006/0147723 A1 | 7/2006 | Jing et al. |
| 2006/0147724 A1 | 7/2006 | Mizuno |
| 2006/0155594 A1 | 7/2006 | Almeida et al. |
| 2006/0159938 A1 | 7/2006 | Lee et al. |
| 2006/0205236 A1 | 9/2006 | Li et al. |
| 2006/0258146 A1 | 11/2006 | Runtala et al. |
| 2006/0264595 A1 | 11/2006 | Lyu |
| 2006/0286813 A1 | 12/2006 | Meredith et al. |
| 2006/0289849 A1 | 12/2006 | Yagihashi et al. |
| 2007/0004587 A1 | 1/2007 | Chebiam et al. |
| 2007/0018926 A1 | 1/2007 | Shin et al. |
| 2007/0020899 A1 | 1/2007 | Hirai et al. |
| 2007/0021025 A1 | 1/2007 | Kim et al. |
| 2007/0022909 A1 | 2/2007 | Kennedy et al. |
| 2007/0023837 A1 | 2/2007 | Lee et al. |
| 2007/0023864 A1 | 2/2007 | Khater |
| 2007/0024181 A1 | 2/2007 | Oh |
| 2007/0024766 A1 | 2/2007 | Song et al. |
| 2007/0024770 A1 | 2/2007 | Jang |
| 2007/0024775 A1 | 2/2007 | Lee |
| 2007/0024783 A1 | 2/2007 | Joo |
| 2007/0024788 A1 | 2/2007 | Kamiya |
| 2007/0024790 A1 | 2/2007 | Chang |
| 2007/0026104 A1 | 2/2007 | Nakano |
| 2007/0029547 A1 | 2/2007 | Parker |
| 2007/0030407 A1 | 2/2007 | Kwak et al. |
| 2007/0030428 A1 | 2/2007 | Lu et al. |
| 2007/0030431 A1 | 2/2007 | Lee et al. |
| 2007/0030434 A1 | 2/2007 | Hirabayashi et al. |
| 2007/0030437 A1 | 2/2007 | Kim |
| 2007/0034879 A1 | 2/2007 | Park |
| 2007/0035225 A1 | 2/2007 | Lee et al. |
| 2007/0035673 A1 | 2/2007 | Sakurai et al. |
| 2007/0035675 A1 | 2/2007 | Um et al. |
| 2007/0074757 A1 | 4/2007 | Mellott et al. |
| 2007/0088144 A1 | 4/2007 | Kang et al. |
| 2007/0111014 A1 | 5/2007 | Katsoulis et al. |
| 2007/0116966 A1 | 5/2007 | Mellott et al. |
| 2007/0206283 A1 | 9/2007 | Ohtani et al. |
| 2007/0275257 A1* | 11/2007 | Muraguchi et al. ........... 428/522 |
| 2008/0032052 A1 | 2/2008 | Kourtakis et al. |
| 2008/0157065 A1 | 7/2008 | Krishnamoorthy et al. |
| 2008/0185041 A1 | 8/2008 | Sharma et al. |
| 2008/0206690 A1 | 8/2008 | Kennedy et al. |
| 2008/0295884 A1 | 12/2008 | Sharma et al. |
| 2009/0004606 A1 | 1/2009 | Albaugh et al. |
| 2009/0026924 A1 | 1/2009 | Leung et al. |
| 2009/0029145 A1 | 1/2009 | Thies et al. |
| 2009/0068377 A1 | 3/2009 | Kuki |
| 2009/0087665 A1 | 4/2009 | Suzuki et al. |
| 2009/0101203 A1 | 4/2009 | Sharma |
| 2009/0101209 A1 | 4/2009 | Sharma et al. |
| 2009/0275694 A1 | 11/2009 | Baldwin-Hendricks et al. |
| 2010/0027144 A1 | 2/2010 | Varaprasad et al. |
| 2010/0092763 A1 | 4/2010 | Kleiman-Shwarsctein et al. |

FOREIGN PATENT DOCUMENTS

| | | |
|---|---|---|
| EP | 0144880 | 11/1984 |
| EP | 0130801 | 1/1985 |
| EP | 0146411 B1 | 6/1985 |
| EP | 0152377 | 11/1985 |
| EP | 0323186 | 7/1989 |
| EP | 0184248 | 8/1989 |
| EP | 0327311 B1 | 8/1989 |
| EP | 0229629 | 4/1991 |
| EP | 0423446 | 4/1991 |
| EP | 0427395 | 5/1991 |
| EP | 0449263 | 10/1991 |
| EP | 0217137 | 4/1992 |
| EP | 0494744 | 7/1992 |
| EP | 0159428 | 11/1992 |
| EP | 0204963 | 1/1993 |
| EP | 0388503 | 9/1993 |
| EP | 0458651 | 3/1994 |
| EP | 0225676 | 7/1994 |
| EP | 0401499 | 12/1995 |
| EP | 0422570 | 12/1995 |
| EP | 0727711 | 8/1996 |
| EP | 0659904 B1 | 7/1998 |
| EP | 0851300 | 7/1998 |
| EP | 0881678 | 12/1998 |
| EP | 0902067 | 3/1999 |
| EP | 0911875 | 4/1999 |
| EP | 1142832 | 4/2000 |
| EP | 1046689 | 10/2000 |
| EP | 0687004 | 12/2002 |
| EP | 1296365 | 3/2003 |
| EP | 1376671 | 1/2004 |
| EP | 1659423 | 5/2006 |
| EP | 1674904 | 6/2006 |
| EP | 1829945 | 9/2007 |
| GB | 1385241 | 2/1975 |
| GB | 1601288 | 10/1981 |
| GB | 2424382 | 9/2006 |
| JP | 53124561 | 10/1978 |
| JP | 55-063335 | 5/1980 |
| JP | 55165942 | 12/1980 |
| JP | 56000627 | 1/1981 |
| JP | 56000828 | 1/1981 |
| JP | 81028935 | 7/1981 |
| JP | 56118465 | 9/1981 |
| JP | 56129261 | 10/1981 |
| JP | 56139533 | 10/1981 |
| JP | 56151731 | 11/1981 |
| JP | 57008279 | 1/1982 |
| JP | 57038865 | 3/1982 |
| JP | 57083563 | 5/1982 |
| JP | 57112047 | 7/1982 |
| JP | 57125905 | 8/1982 |
| JP | 57131250 | 8/1982 |
| JP | 57141641 | 9/1982 |
| JP | 57141642 | 9/1982 |
| JP | 57168246 | 10/1982 |
| JP | 57168247 | 10/1982 |
| JP | 58-003249 | 1/1983 |
| JP | 83007001 | 2/1983 |
| JP | 58-066335 | 4/1983 |
| JP | 58174480 | 10/1983 |
| JP | 59109565 | 6/1984 |
| JP | 59112487 | 6/1984 |
| JP | 59112834 | 6/1984 |
| JP | 59132423 | 7/1984 |
| JP | 59189126 | 10/1984 |
| JP | 59190211 | 10/1984 |
| JP | 60042426 | 3/1985 |
| JP | 60076528 | 5/1985 |
| JP | 60086017 | 5/1985 |
| JP | 60116132 | 6/1985 |
| JP | 60152552 | 8/1985 |
| JP | 60195148 | 10/1985 |
| JP | 60254034 | 12/1985 |
| JP | 60254035 | 12/1985 |
| JP | 61014096 | 1/1986 |
| JP | 61020024 | 1/1986 |

(56) References Cited

FOREIGN PATENT DOCUMENTS

| | | |
|---|---|---|
| JP | 61098747 | 5/1986 |
| JP | 61108628 | 5/1986 |
| JP | 61127732 | 6/1986 |
| JP | 61221232 | 10/1986 |
| JP | 61224330 | 10/1986 |
| JP | 61256347 | 11/1986 |
| JP | 61260242 | 11/1986 |
| JP | 61274497 | 12/1986 |
| JP | 62027417 | 2/1987 |
| JP | 62043426 | 2/1987 |
| JP | 62056956 | 3/1987 |
| JP | 62067561 | 3/1987 |
| JP | 62096942 | 5/1987 |
| JP | 62161124 | 7/1987 |
| JP | 62215944 | 9/1987 |
| JP | 62275643 | 12/1987 |
| JP | 62299965 | 12/1987 |
| JP | 63005337 | 1/1988 |
| JP | 63006544 | 1/1988 |
| JP | 63046272 | 2/1988 |
| JP | 63072745 | 4/1988 |
| JP | 63106649 | 5/1988 |
| JP | 63117074 | 5/1988 |
| JP | 63118739 | 5/1988 |
| JP | 63120774 | 5/1988 |
| JP | 63137437 | 6/1988 |
| JP | 63137972 | 6/1988 |
| JP | 63149636 | 6/1988 |
| JP | 63152130 | 6/1988 |
| JP | 63172757 | 7/1988 |
| JP | 63199251 | 8/1988 |
| JP | 63207829 | 8/1988 |
| JP | 63218947 | 9/1988 |
| JP | 63218948 | 9/1988 |
| JP | 63238133 | 10/1988 |
| JP | 63287823 | 11/1988 |
| JP | 63289045 | 11/1988 |
| JP | 63308077 | 12/1988 |
| JP | 63312643 | 12/1988 |
| JP | 1016868 | 1/1989 |
| JP | 64001769 | 1/1989 |
| JP | 1038256 | 2/1989 |
| JP | 1056710 | 3/1989 |
| JP | 1076046 | 3/1989 |
| JP | 1110546 | 4/1989 |
| JP | 1115966 | 5/1989 |
| JP | 1168718 | 7/1989 |
| JP | 1185367 | 7/1989 |
| JP | 1203013 | 8/1989 |
| JP | 1204043 | 8/1989 |
| JP | 1204432 | 8/1989 |
| JP | 1207310 | 8/1989 |
| JP | 1217352 | 8/1989 |
| JP | 1245248 | 9/1989 |
| JP | 1308429 | 12/1989 |
| JP | 1313942 | 12/1989 |
| JP | 2000615 | 1/1990 |
| JP | 2008209 | 1/1990 |
| JP | 2038427 | 2/1990 |
| JP | 2099955 | 4/1990 |
| JP | 2110464 | 4/1990 |
| JP | 2124936 | 5/1990 |
| JP | 02145511 | 6/1990 |
| JP | 2150426 | 6/1990 |
| JP | 2163744 | 6/1990 |
| JP | 2178330 | 7/1990 |
| JP | 2308806 | 12/1990 |
| JP | 3007766 | 1/1991 |
| JP | 3014456 | 1/1991 |
| JP | 3026716 | 2/1991 |
| JP | 3028852 | 2/1991 |
| JP | 3031325 | 2/1991 |
| JP | 3045628 | 2/1991 |
| JP | 3047883 | 2/1991 |
| JP | 03050459 | 3/1991 |
| JP | 3059016 | 3/1991 |
| JP | 3064337 | 3/1991 |
| JP | 3064753 | 3/1991 |
| JP | 3152544 | 6/1991 |
| JP | 3154007 | 7/1991 |
| JP | 3162441 | 7/1991 |
| JP | 3197135 | 8/1991 |
| JP | 3200257 | 9/1991 |
| JP | 3207774 | 9/1991 |
| JP | 3209476 | 9/1991 |
| JP | 3252446 | 11/1991 |
| JP | 3257027 | 11/1991 |
| JP | 3272131 | 12/1991 |
| JP | 05125187 | 5/1993 |
| JP | 06056560 | 3/1994 |
| JP | 6129153 | 5/1994 |
| JP | 7309882 | 11/1995 |
| JP | 7325383 | 12/1995 |
| JP | 2001-092122 | 4/2001 |
| JP | 2002-129103 | 5/2002 |
| JP | 2002-235037 | 8/2002 |
| JP | 2003-050459 | 2/2003 |
| JP | 2003-064306 | 3/2003 |
| JP | 2003-064307 | 3/2003 |
| JP | 2003-183575 | 7/2003 |
| JP | 2003-253204 | 9/2003 |
| JP | 2003-257963 | 9/2003 |
| JP | 2004-277501 | 10/2004 |
| JP | 2005-042118 | 2/2005 |
| JP | 2005-048190 | 2/2005 |
| JP | 2005-072615 | 3/2005 |
| JP | 2005-099693 | 4/2005 |
| JP | 2005-105281 | 4/2005 |
| JP | 2005-105282 | 4/2005 |
| JP | 2005-105283 | 4/2005 |
| JP | 2005-105284 | 4/2005 |
| JP | 2005-136429 | 5/2005 |
| JP | 2005-139265 | 6/2005 |
| JP | 2005-146282 | 6/2005 |
| JP | 2006-045352 | 2/2006 |
| JP | 2006-182811 | 7/2006 |
| JP | 2006-183028 | 7/2006 |
| JP | 2006-183029 | 7/2006 |
| JP | 2006-213908 | 8/2006 |
| JP | 2006-241407 | 9/2006 |
| JP | 2006-249181 | 9/2006 |
| WO | WO 90/03598 | 4/1990 |
| WO | WO 00/31183 | 6/2000 |
| WO | WO 00/41231 | 7/2000 |
| WO | WO 00/77575 | 12/2000 |
| WO | WO 01/29052 | 4/2001 |
| WO | WO 02/06402 | 1/2002 |
| WO | WO 02/16477 | 2/2002 |
| WO | WO 02/32823 | 4/2002 |
| WO | WO 03/044077 | 5/2003 |
| WO | WO 03/044078 | 5/2003 |
| WO | WO 03/044600 | 5/2003 |
| WO | WO 03/052003 | 6/2003 |
| WO | WO 03/070809 | 8/2003 |
| WO | WO 03/088343 | 10/2003 |
| WO | WO 03/088344 | 10/2003 |
| WO | WO 03/089992 | 10/2003 |
| WO | WO 2004/044025 | 5/2004 |
| WO | WO 2005/036270 | 4/2005 |
| WO | WO 2005/037907 | 4/2005 |
| WO | WO 2005/049757 | 6/2005 |
| WO | WO 2005/080629 | 9/2005 |
| WO | WO 2006/122308 | 11/2006 |
| WO | WO 2006/128232 | 12/2006 |
| WO | WO 2008/030364 | 3/2008 |
| WO | WO 2009/015119 | 1/2009 |
| WO | WO 2009/038250 | 3/2009 |
| WO | 2009069712 A1 | 6/2009 |
| WO | WO 2010/079495 | 7/2010 |

OTHER PUBLICATIONS

Yao et al. Acta Phys.—Chim. Sin. (Wuli Huaxue Xuebao), 2002, vol. 18, 781-785.*

(56) References Cited

OTHER PUBLICATIONS

"HD Micro Puts Out Positive Polyamide," Electronic News, Jun. 19, 2000, 1 page.
Akamatsu, Yoshinori et al., "Effect of the Additives in Sols on the Surface Roughness of the Coating Films Derived from Mixtures of Tetraethoxysilane-and Methyltriethoxysilane-Derived Sols", Journal of the Ceramic Society of Japan III(9) 636-639 (2003).
AlliedSignal ACCUGLASS.RTM. T-04 Spin-On Glass Material Safety Data Sheet dated Jun. 30, 1998.
AlliedSignal ACCUSPIN.RTM. 720 Spin-On Polymer Product Bulletin dated Sep. 1995.
Andrews, et al., "Spinnable and UV-Patternable Hybrid Sol-Gel Silica Glass for Direct Semiconductor Dielectric Layer Manufacturing", p. 347, SPIE 25th Annual Symposium on Microlithography, Feb. 27-Mar. 3, 2000.
Bohmer, M.R. et al., "Chapter 8: Sol-Gel Coatings for Optical and Dielectric Applications", Handbook of Advanced Electronic and Photonic Materials and Devices, vol. 5: © 2001, pp. 219-262.
Brewer et al. "The Reduction of the Standing-wave Effect in Positive Photoresists", Journal of Applied Photographic Engineering, Dec. 1981, vol. 7, No. 6, pp. 184-186.
Chou, et al., "Anti-Reflection Strategies for Sub-0.18.mu.m Dual Damascene Patterning in KrF 248nm Lithography", p. 453, SPIE 25th Annual Symposium on Microlithography, Feb. 27-Mar. 3, 2000.
Chun, et al., "Novel Hardening Methods of DUV Chemically Amplified Photoresist by ION Implanation and Its Application to New Organic ARC Material and Bilayer Process", p. 360, SPIE 25th Annual Symposium on Microlithography, Feb. 27-Mar. 3, 2000.
Coles, A.X. et al., "Optimization of Porous Silicon Reflectance for Solar Cell Applications", Mat. Res. Soc. Symp. Proc. vol. 426 1996 Materials Research Society, pp. 557-562.
Crivello et al., Diaryhodonium Salts as Thermal Initiators of Cationic Polymerication, Journal of Polymer Science: Polymer Chemistry Edition, vol. 21, 1983, pp. 97-109.
Del Puppo, Helene et al., "A Novel Organic Resist Removal and Cleaning Technology", p. 228, SPI 25.sup.th Annual Symposium on Microlithography, Feb. 27-Mar. 3, 2000.
Ding et al., Process and Performance Optimization on Bottom Anti-Reflective Coatings (Part II), p. 328, SPIE 25.sup.th Annual Symposium onMicrolithography, Feb. 27-Mar. 3, 2000.
Dynasylan® brochure entitled "Silanes for Adhesives and Sealants", 5 pages, available at www.dynasylan.com.
Hawley's Condensed Chemical Dictionary, 11th ed., 85-86.
Honeywell, "Material Safety Data Sheet, Accuglass T-04 Spin-On Glass", Jun. 30, 1998, pp. 1-7.
International Search Report and Written Opinion issued in PCT/US2010/037898, mailed Jan. 24, 2011, 11 pages.
Izumi, Yusuke et al., "Hydrosilyation of Carbonyl Compounds Catalyzed by Solid Acids and Bases," Tetrahedron Letters, vol. 32, No. 36, pp. 4744 (1991).
Jaskot et al., "Toxicity of an Anthraquinone Violet Dye Mixture Following Inhalation Exposure, Intratracheal Instillation, or Gavage", Fundamental and Applied Toxicological 22, 103-112 (1994).
Korchkov, et al. entitled "Low Temperature Dielectric Films From Octavinylsilsequioxane", Dec. 1982, pp. 373-376.
Lamola, A. et al., "Chemically Amplified Resists," Solid State Technology, 53-60 (Aug. 1991).
Lavrent'yev, et al. entitled "Ethylmethyloctasesquioxanes: Products of the Reactions of Ethylpolycyclosiloxanes with Tricholormethylsilane. Their Chromatographic Mass Spectrometric Investigation," 1981.
Lavrent'yev, et al. entitled "Polyhedral Oligosilsesquioxanes and Their Homo Derivatives", Aug. 1981, pp. 199-236.
Li, et al. entitled "An Organosiloxane Spin on Bottom Antireflective Coating for ArF Lithography", pp. 1-9.
Li, et al. entitled "Organosiloxane Based Bottom Antireflective Coatings for 193nm Lithography", pp. 1-10.
Lien, Shui-Yang et al., "Tri-layer antireflection coatings ($SiO_2$/$SiO_2$-$TiO_2$/$TiO_2$) for silicon solar cells using a sol-gel technique", Solar Energy Materials & Solar Cells 90 (2006) 2710-2719.
Lin et al, "Dual Layer Inorganic SiON Bottom ARC for 0.25 um DUV Hard Mask Applications", p. 246, SPIE 25.sup.th Annual Symposium of Microlithography, Feb. 27-Mar. 3, 2000.
Lin et al. "Linewidth Control Using Anti-Reflective Coating for Optical-Lithography", pp. 399-402.
Lin, Yi-Ching et al., "Some Aspects of Anti-Reflective Coating for Optical Lithography," Advances in Resist Technology and Processing, Proc., SPIE vol. 469, 30-37 (1984).
Lu, "Performance impact of novel polymetric dyes in photoresist application", p. 346, SPIE 25th Annual Symposium on Microlithography, Feb. 27-Mar. 3, 2000.
Lucus, et al., "Anti-Reflective Coating Optimizing Techniques for sub-0.2um Geometrics", Motorola, Advanced Products Research and Development Lab, p. 171, SPIE 25.sup.th Annual Symposium on Microlithography, Feb. 27-Mar. 3, 2000.
McKean et al., "Characterization of a Novolac-Based Three-Component Deep-UV Resist," Chem. Mater. (1990) 2, 619-624.
Meador, "Recent Progress in 1993 nm Anti-reflective Coatings", p. 311, SPIE 25.sup.th Annual Symposium on Microlithography, Feb. 27-Mar. 3, 2000.
Mizutani, et al., "Design of a new bottom anti-reflective Coating Composition for KrF resist", p. 277, SPIE 25.sup.th Annual Symposium on Microlithography, Feb. 27-Mar. 3, 2000.
Nakaoka, et al., "Comparison of CD variation between organic and inorganic bottom anti-reflective coating on Topographic Substrates", p. 454, SPIE 25th Annual Symposium on Microlithography, Feb. 27-Mar. 3, 2000.
Nalamasu et al., "Development of a Chemically Amplified Positive (CAMP) Resist Material for Single Layer Deep-UV Lithography," Advances in Resist Technology and Processing VII, SPIE vol. 1262, 1990, pp. 32-41.
Onishi, "Application of Polysilanes for Deep UV anti-reflective Coating", p. 248, SPIE 25.sup.th Annual Symposium on Microlithography, Feb. 27-Mar. 3, 2000.
Pacansky, et al. entited "Photochemical Decomposition Mechanisms for AZ-Type Photoresists", Jan. 1979, pp. 42-55.
Padmanaban, M. et al., "Bottom Anti-Reflective Coatings for Arl, KrF, and I-line Applications: A Comparison of Theory, Design and Lithographic Aspects", p. 281, SPIE 25.sup.th Annual Symposium on Microlithography, Feb. 27-Mar. 3, 2000.
Raboin, L. et al., "Nanostructured Sol-Gel Coatings for Optical Applications", Advances in Science and Technology vol. 55 (2008) pp. 199-204.
Resiser "Photoreactive Polymers—Multilayer Techniques and Plasma Processing", pp. 359-367.
Schiavone, et al., "SiON based Anti-reflective Coating for 193nm Lithography", p. 335, SPIE 25.sup.th Annual Symposium on Microlithography, Feb. 27-Mar. 3, 2000.
Sheates "Photobleaching Chemistry of Polymers. Containing", pp. 332-348.
Singer, "Anti-Reflective Coatings: A Story of Interfaces" Semiconductor International, pp. 55-60 (Mar. 1999).
Stephen, et al., "Antireflective Coating for 193nm Lithography", p. 355, SPIE 25th Annual Symposium on Microlithography, Feb. 27-Mar. 3, 2000.
Tanaka et al. "A New Photolighography Technique with Antireflective Coating on Resist: ARCOR", pp. 3900-3904.
Taylor, et al., Methyacrylate Resists and Antireflective Coatings for 193 nm "Lithography", p. 245, SPIE 25.sup.th Annual Symposium on Microlithography, Feb. 27-Mar. 3, 2000.
Trefonas, "Organic Anti-Reflective Coatings for 193nm Lithography", p. 298, SPIE 25.sup.th Annual Symposium on Microlighotraphy, Feb. 27-Mar. 3, 2000.
van Wingerden, "Joint optimisation of substrate reflectivity, resist thickness and resist absorption for CD control and resolution", p. 451, SPIE 25th Annual Symposium on Microlithography, Feb. 27-Mar. 3, 2000.
Willson, C.G., "Organic Resist Material—Theory and Chemistry," Introduction to Microlithography, American Chemical Society, 87-159 (1983).

(56) References Cited

OTHER PUBLICATIONS

Wu, Guangming et al., "A novel route to control refractive index of sol-gel derived nano-porous silica films used as broadband antireflective coatings", Materials Science and Engineering B78 (2000) 135-139.

Yamanaka, et al., "Suppression of Resist Pattern Deformation on SiON Bottom Anti-Reflective Layer for Deep UV Lithography", p. 247, SPIE 25.sup.th Annual Symposium on Microlithography, Feb. 27-Mar. 3, 2000.

Brogren, Maria et al., "Optical Efficiency of a PV-Thermal hybrid CPC Module for High Latitudes", Solar Energy vol. 69(Suppl), Nos. 1-6, pp. 173-185, 2000.

Honeywell ACCUGLASS.RTM. T-08 Spin-On Glass Material Safety Data Sheet dated Jun. 19, 2002, Revision A.

Honeywell ACCUSPIN.RTM 720 Spin-On Glass Material Safety Data Sheet dated Mar. 7, 2000.

Nagel, H. et al. "Porous $SiO_2$ films prepared by remote plasma-enhanced chemical vapour deposition—a novel antireflection coating technogy for photovoltaic modules", Solar Energy Materials & Solor Cells, vol. 65 (2001) pp. 71-77.

Sermon, P.A. et al., "$MgF_2$ Xerogels", Journal of Sol-Gel Science and Technology, vol. 32, 149-153, 2004.

Vergohl, M. et al., "Ex situ and in situ spectroscopic ellipsometry of MF and DC—sputtered $TiO_2$ and $SiO_2$ films for process control", Thin Solid Films, vol. 351 (1999) pp. 42-47.

Xiao, Yiqun et al., "Microstructure Control of nanoporous Silica Thin Film Prepared by Sol-gel Process", J. Mater. Sci. technol., vol. 23, No. 4, 2007, pp. 504-508.

Zhang, Xin-Tong et al., "Self-Cleaning Particle Coating with Antireflection Properties", Chem. Mater. 2005, vol. 17, pp. 696-700.

European Search Report mailed Oct. 18, 2012 from the European Patent Office in European Patent Application No. 10786741.8.

International Search Report and Written Opinion Issued in PCT/US2010/030255, mailed Sep. 3, 2010, 10 pages.

\* cited by examiner

ANTI-REFLECTIVE COATINGS FOR OPTICALLY TRANSPARENT SUBSTRATES

RELATED APPLICATION

This application is a divisional of U.S. patent application Ser. No. 12/796,199, filed Jun. 8, 2010, which is a non-provisional of U.S. Provisional Application Ser. No. 61/268,231, filed Jun. 10, 2009, which are hereby incorporated herein by reference in their entirety for all purposes. This application is incorporated by reference herein in its entirety.

TECHNICAL FIELD

The invention relates generally to anti-reflective coatings for optically transparent elements and more particularly to anti-reflective coatings for glass covers used in photovoltaic cell applications.

BACKGROUND

Anti-reflective (AR) coatings are used in several industries, including in the manufacture of photovoltaic (PV) modules, to reduce the reflection fraction of incident light as light passes through an optically transparent element such as glass. The goal of AR coatings is to achieve a refractive index that is as close to 1.23 as possible to maximize light transmission over a broad band of light wavelengths.

One or more layers of a low refractive index coating can achieve improved transmittance in a broad wavelength range and a wide range of incident angles. Such coatings can be deposited (at atmospheric pressure or without vacuum) as sol-gel materials and can be highly cost-effective. These thin anti-reflective coatings, which may be formed from a silicon dioxide sol-gel applied to the glass cover by conventional coating techniques, have been reported to improve solar light transmittance by about two to three percent in the visible portion of the light spectrum. Such sol-gels have been formed using several mechanisms including via hydrolysis/condensation reaction of alkoxy silanes. See, e.g., G. Wu et al., "A novel route to control refractive index of sol-gel derived nanoporous films used as broadband antireflective coatings," Materials Science and Engineering B78 (2000), pp. 135-139. However, AR coatings formed from silicon dioxide coatings would benefit from improved hardness, adhesion, shelf-life and/or processing efficiency.

SUMMARY

Embodiments disclosed herein pertain to AR coatings and coating solutions, optically sensitive elements such as photovoltaic modules that employ AR coatings, and improved processes for preparing AR coatings and coating solutions.

One embodiment is an optically transparent element including an optically transparent substrate and an AR coating disposed on at least one surface of the optically transparent substrate. The AR coating includes a polymer having at least one tetraalkoxy silane residue and a second alkoxy silane residue. The at least one tetraalkoxy silane residue may include tetraethoxy silane. The second alkoxy silane residue may include triethoxysilanes such as methyltriethoxy silane and vinyltriethoxy silane, diethoxy silanes such as dimethyldiethoxy silane and methyldiethoxy silane and/or combinations of the foregoing. The polymer may further include metal alkoxide residues such as titanium isopropoxide. The polymer contained in the AR coating may comprise polymer particles having an average size of no more than 100 nm.

Another embodiment is a photovoltaic module including at least one optically transparent element described above.

Another embodiment also provides a method of producing an AR coating solution in which at least two alkoxy silane materials as described above are combined in a solvent with a base catalyst under suitable reaction conditions to form an AR coating solution. The pH of the AR coating solution is then reduced, and the resulting average polymer particle size in the AR coating solution is between about 15 nm and about 100 nm. A further embodiment is a method of forming an optically transparent element by dispensing the AR coating solution onto an optically transparent substrate and curing.

A further embodiment provides an AR coating solution including a polymer having residues of tetraethoxy silane, methyltriethoxy silane and/or vinyltriethoxy silane. The AR coating solution has a pH of less than 5 and a viscosity of less than 2 cP. The pH and viscosity of the AR coating solution are stable for at least 24 hours at room temperature.

DETAILED DESCRIPTION

Figure 1:
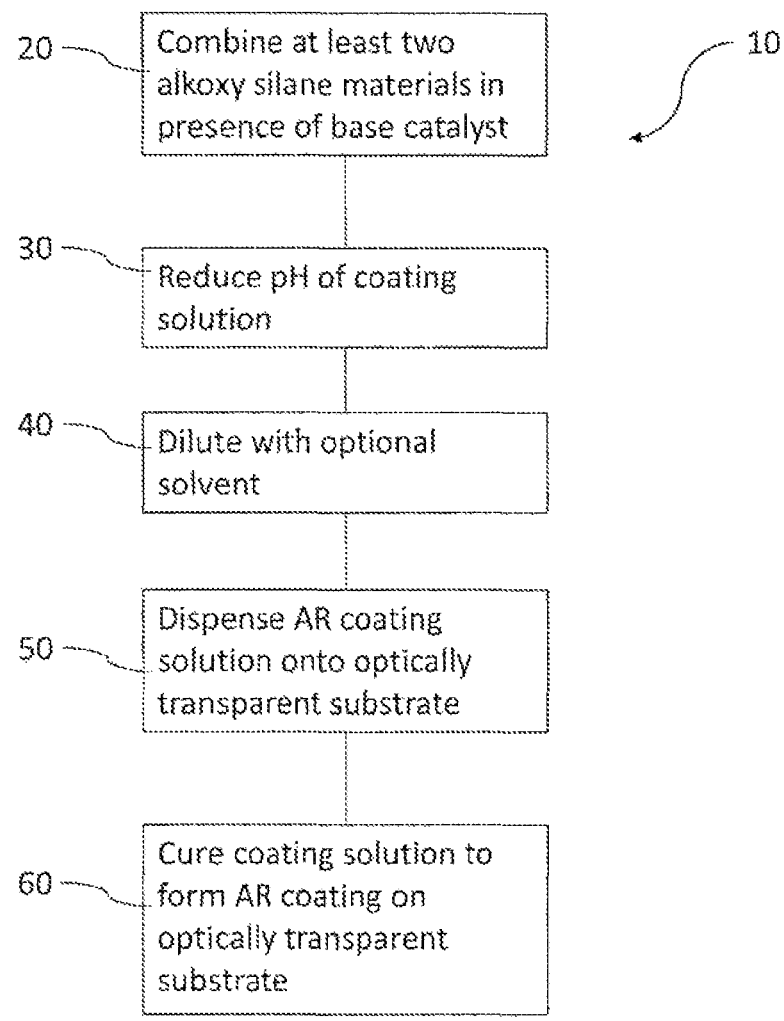
FIG. 1 is a flow chart of a method of producing an optically transparent element including an AR coating in accordance with an embodiment of the invention.

FIG. 1 is a flow chart illustrating a method 10 of forming an AR coating solution and optically transparent element according to one embodiment. According to the method 10, an AR coating solution is formed by combining at least two different alkoxy silane materials in a solvent and in the presence of a base catalyst under suitable reaction conditions to cause polymerization of the alkoxy silane materials (Block 20). The resulting AR coating solution includes a polymer having at least two different alkoxy silane residues.

After combining the alkoxy silane materials, an acid may be added to the AR coating solution to adjust the solution pH (Block 30) and/or the AR coating solution may be further combined with at least one additional solvent (Block 40). In one embodiment, exemplary AR coating solutions are formed without the use of poragens such as polyethylene glycols or polyethylene oxides that evaporate during thermal processing steps to form pores. Additionally, the AR coating solutions are formed without having to filter the resulting polymer from the reaction solution or to remove components in the solution as required by other reaction methods.

The AR coating solution is dispensed onto an optically transparent substrate such as a glass substrate (e.g., sodalime glass, float glass, borosilicate and low iron sodalime glass), plastic cover, acrylic Fresnel lense or other optically transparent substrate (Block 50). The AR coating solution is then cured to form an AR coating on the optically transparent substrate (Block 60).

A variety of commercially available alkoxy silanes may be used to form the AR coating solution. Suitable alkoxy silanes that comprise the first of the at least two alkoxy silane materials include tetraalkoxy silanes, which may include one or more ethoxy, methoxy, and/or propoxy groups as well as hydrogen, methyl, ethyl or propyl groups. In one embodiment, at least one of the alkoxy silane materials is tetraethoxy silane (TEOS).

A second alkoxy silane material may be added to promote improved AR coating adhesion and/or other improved coating properties. Examples of these materials include trialkoxy silanes such as methyltriethoxy silane (MTEOS), aminopropyltriethoxy silane (APTEOS) and APTEOS-triflate, vinyltriethoxy silane (VTEOS), and diethylphosphatoethyltriethoxy silane. Examples also include dialkoxy silanes such as methyldiethoxy silane (MDEOS) dimethyldiethoxy silane (DMDEOS), and phenyldiethoxy silane (PDEOS). Suitable monoalkoxy silanes include trimethoxy silanes such as (3-glycidoxypropyl)-trimethoxy silane. Carbosilanes, mercapto silanes, hydridosilanes and silazanes such as dimethyldisilazane may also be suitable. Combinations of these second alkoxy silane materials may also be used. For example, MTEOS and/or VTEOS may be particularly suitable for improving adhesion and/or hardness. In one embodiment, the second alkoxy silane material or combination of materials may be combined with the first alkoxy silane material in an amount ranging from up to about 50 mol % to 40 mol % to 35 mol % to 25 mol % to 15 mol % based on the total moles of alkoxy silane material. In another embodiment, the second alkoxy silane material may be added in an amount ranging from at least about 10 mol % to at least about 40 mol % based on the total moles of both alkoxy silane materials. The molar ratio of the first alkoxy silane to the second alkoxy silane material may range from 1:1 to 1000:1, more particularly from 10:1 to 500:1 and even more particularly from 25:1 to 100:1.

In addition to the alkoxy silane materials, at least one metal alkoxide may be included in the AR coating solution. Suitable metal alkoxides include metal isopropoxides and metal butoxides. Examples of metal isopropoxides include zirconium isopropoxide and titanium isopropoxide (TIPO). Examples of suitable metal butoxides include hafnium-n-butoxide and zirconium-n-butoxide. TIPO may be particularly suitable for improving AR coating hardness. In one embodiment, the AR coating solution includes less than 1 mol % metal alkoxide based on the total moles of metal alkoxide and alkoxy silane.

Combinations of the foregoing materials may be utilized to achieve desirable coating properties. In one embodiment, the AR coating solution includes TEOS and MTEOS. In another embodiment, the AR coating solution includes TEOS, MTEOS, VTEOS. In a further embodiment, the AR coating solution includes TEOS, MTEOS, VTEOS and TIPO.

Suitable base catalysts added to the AR coating solution include, for example, quaternary amine compounds of the formula $R_1R_2R_3R_4N^+OH^-$ in which $R_1$, $R_2$, $R_3$ and $R_4$ are each independently phenyl, hydrogen or a $C_{1-16}$ alkyl. In some embodiments, suitable base catalysts include quaternary amine hydroxides such as tetrabutylammonium hydroxide and tetramethylammonium hydroxide. In some embodiments, suitable base catalysts include aqueous solutions of these components, and may optionally include additional distilled water beyond that found in the base catalyst aqueous solutions.

Examples of suitable solvents or diluents that may be used in the AR coating solution include but are not limited to acetone, water, propylene glycol methyl ether acetate (PGMEA), isopropyl alcohol (IPA), tetrahydrofuran (THF), ethanol, dipropylene glycol, tetraethylene glycol, ethyl acetate, PGME and combinations. In some embodiments, the solvent is free of acetone.

These components may be combined and reacted in, for example, a jacketed stirred tank reactor (STR) via a batch or semi-batch mode for a suitable reaction time in the range of about 1 to about 6 hours, more particularly 1 to 3.5 hours and at a suitable temperature in the range of about 35° C. to 70° C.

Figure 3:
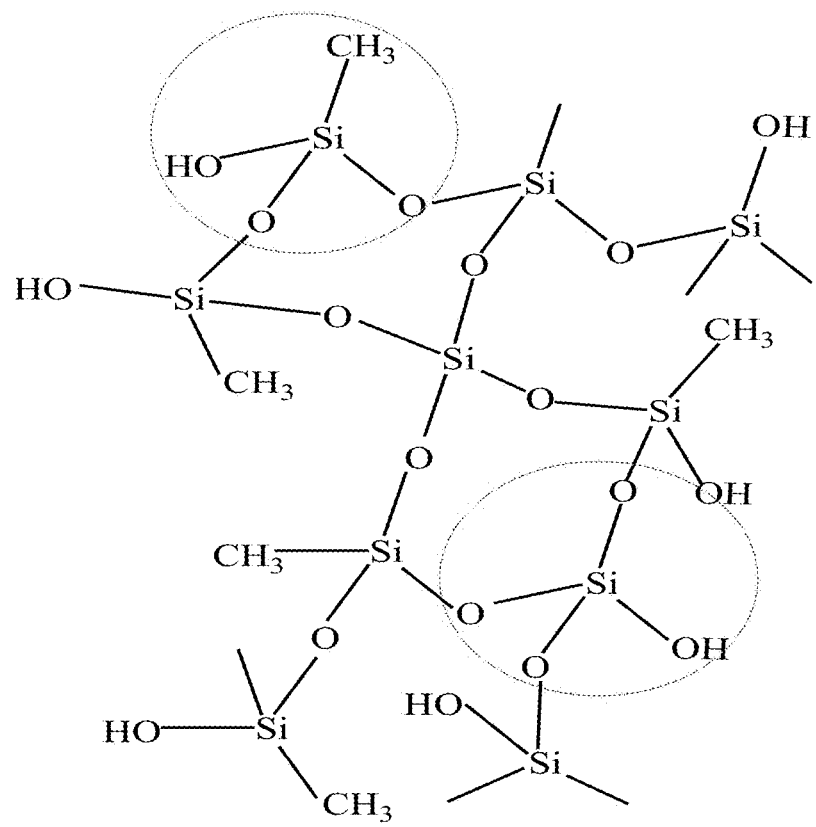
FIG. 3 is a schematic illustration of a portion of a polymer molecule in accordance with one embodiment of the present invention.

Under the foregoing conditions, a hydrolysis reaction takes place to form a polymer in solution. Depending on the reaction conditions, the polymer contained in the solution may vary from linear or randomly branched chains, to porous matrices, to dense colloidal particles. In any case, the resulting polymer will include residues of at least two different alkoxy silane materials as described above and/or the optional metal alkoxide materials. The term "residue" as used herein is intended to refer to a portion of the polymer molecule derived from the alkoxy silane and/or metal alkoxide materials initially added to the AR coating solution. By way of example, it is generally known that tetraethoxy silane reacts under the foregoing conditions to form units of $SiO_4$, which would constitute one example of a tetraethoxy silane residue. It will also be appreciated that certain by-products may be formed and contained in the AR coating solution either as part of the polymer or as a separate component. For example, the hydrolysis of TEOS may result in the formation of ethanol as a by-product. FIG. 3 illustrates a depiction of an exemplary polymer molecule portion with certain residues circled.

In any case, the polymer includes at least two different alkoxy silane residues derived from the alkoxy silane materials discussed above. In one embodiment, the polymer includes at least one TEOS residue, at least one MTEOS residue or both. In another embodiment the polymer additionally includes at least one VTEOS residue. In a further embodiment, the polymer additionally includes at least one TIPO residue.

To further control the reaction conditions, the pH of the AR coating solution can be adjusted to between about 0 to about 4.0, more particularly, from about 0 to about 2.0 and even more particularly from about 0.5 to about 1.7 using an acid such as nitric acid after a suitable reaction time. This pH reduction may affect the polymerization condition, which in turn controls the polymer particle size contained in AR coating solution and subsequently cured coating. In one embodiment, the average particle size of the polymer in the AR coating solution may be less than 10 nm, more particularly, less than 1 nm. The average particle size of the AR coating after curing may be between about 15 and about 100 nm, more particularly, between about 25 and about 75 nm, and the polymer may have a molecular weight in the range of about 25,000 to about 150,000 Dalton. The AR coating may also be further diluted with a solvent that includes one or more of water, IPA, acetone and/or PGMEA. Additional acid may be added during dilution to maintain a desired pH.

The AR coating solution may be dispensed onto a surface of an optically transparent element by a variety of generally known coating methods including spin-on, slot die, spray, dip, roller and other coating techniques. The amount of solvent included in the initial reaction or added to the AR coating solution may be varied such that the solids concentration of the AR coating solution ranges from about 1 to about 25 weight percent depending upon the dispensing method. In some embodiments, there may be manufacturing advantages to forming a more concentrated batch in the STR, followed by diluting to a desired concentration. In alternate embodiments, dilution could occur prior to or during the initial mixing stage. For dip coating, a solids concentration of about 10 to 20 weight percent is desired. For other coating methods such as spin, slot die and spray, a lower solids concentration of about 1 to 6 weight percent may be desired. Embodiments of the present invention may be particularly suitable for spray application due to the relatively small polymer particle size achievable by the manufacturing process described above. The viscosity of the resulting coating solution may vary from between about 0.75 cP to about 2.0 cP.

Unlike other methods of forming AR coating materials, the AR coating solution of the present invention is ready for use without removing the particles from solution. Additionally, the AR coating solutions formed by embodiments of the present invention may remain stable for an extended period of time. As used herein, stability refers to the optical and/or mechanical performance characteristics of the coating solution including, without limitation, light transmittance, viscosity, adhesion and/or pH. At room temperature, coating solutions of the present invention may remain stable for at least 24 hours, more particularly, about one week, even more particularly, about 4 weeks. Additionally, coating solutions of the present invention may be stored in a −20° C. to −40° C. freezer for up to at least six months without materially impacting the optical or mechanical properties desired for glass coatings. The ability to preserve AR coatings for an extended period of time may provide a significant manufacturing advantage, particularly if the coating solution is transported to an off-site location and/or stored for a period of time prior to use.

After application, the AR coating solution is cured onto the optically transparent substrate. When applied to glass substrates, the AR coating solution can be subjected to a high temperature heat tempering step, ranging from about 600° C. to about 750° C. depending on the glass composition, for between about 1 minute and about 1 hour to cure the coatings. It will be appreciated that the various alkoxysilane and/or metal alkoxide residues described above may be further modified during the curing process. However, these additional derivative residues still constitute alkoxysilane and/or metal alkoxide residues for the purposes of the present application.

AR coated optically transparent elements according to embodiments of the present invention may possess improved light transmittance characteristics. For example, the AR coating may have a refractive index in the range of about 1.15 to about 1.3, resulting in up to about a 4.26 percent transmission gain in the visible portion (350 to 800 nanometers) of the light spectrum and/or up to about a 3 percent transmission gain in the infrared portion (800 to 2500 nanometers) of the light spectrum.

If both sides of an optically transparent substrate are coated, up to about an 8-9 percent transmission gain in the visible portion of the light spectrum and up to about a 5-7 percent transmission gain in the infrared portion of the light spectrum may be obtained. Exemplary data relating to these properties are presented in the Examples section set forth below. In some embodiments, the absolute gain in transmittance is independent of the coating methods used as long as the thickness of the AR film is tuned to the incident light wavelength (the AR film thickness is about ¼ the wavelength of the incident light).

As further demonstrated in the Examples, AR coatings of the present invention may also have improved adhesion and/or hardness compared to conventional sol gels. Additionally, AR coatings that include TIPO may have self-cleaning properties due to the generation of hydroxyl radicals in the presence of water and solar UV light. The hydroxyl radicals may oxidize water insoluble organic dirt on the glass surface to form highly water-soluble compounds that are washed out during rain. The self-cleaning properties could be optimized according to the amount of TIPO added. In some embodiments, a TIPO content of about 0.0005 moles to about 0.003 moles is exemplary.

Figure 2:
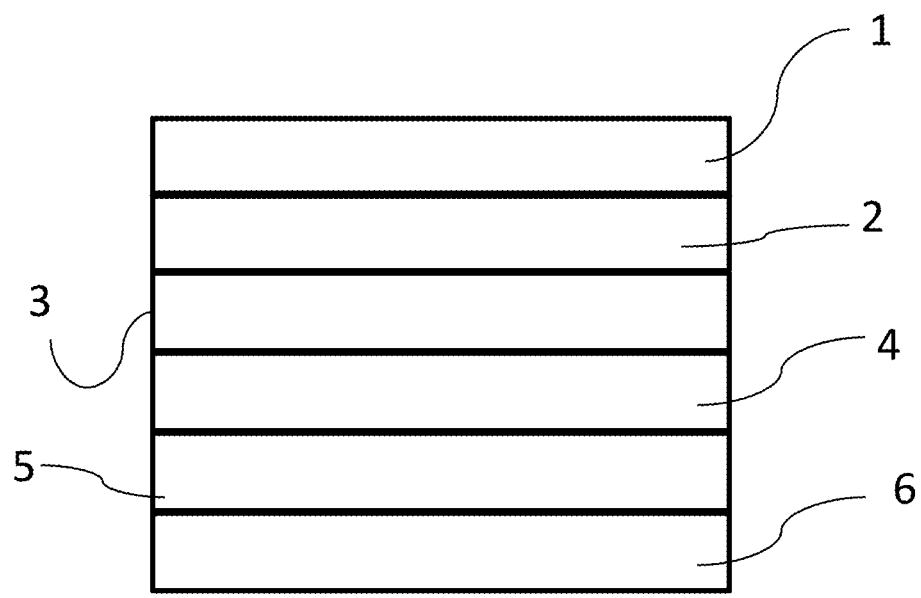
FIG. 2 provides a schematic illustration of a photovoltaic cell including an AR coating in accordance with an embodiment of the invention.

FIG. 2 is a cross-sectional view of a photovoltaic module (e.g., solar cell) for converting light to electricity, according to an embodiment of this invention. Incoming or incident light from the sun or the like is first incident on AR coating 1, passes therethrough and then through glass substrate 2 and front transparent electrode 3 before reaching the photovoltaic semiconductor (active film) 4 of the module. The module may also include, but does not require, a reflection enhancement oxide and/or EVA film 5, and/or a back metallic contact and/or reflector 6 as shown in FIG. 2. Other types of photovoltaic devices may of course be used, and the FIG. 2 module is merely provided for purposes of example and understanding. It will also be understood that a module may include a single AR coated optically transparent substrate that covers multiple photovoltaic cells connected in series.

As explained above, the AR coating 1 reduces reflections of the incident light and permits more light to reach the thin film semiconductor film 4 of the photovoltaic module thereby permitting the device to act more efficiently. While certain of the AR coatings 1 discussed above are used in the context of the photovoltaic devices/modules, this invention is not so limited. AR coatings according to this invention may be used in other applications. Also, other layer(s) may be provided on the glass substrate under the AR coating so that the AR coating is considered disposed on the glass substrate even if other layers are provided therebetween.

Examples 1-16

In Examples 1-16, 122 grams of isopropanol and 62 grams of acetone were charged into a reactor. In Examples 1-10, 0.09 moles of tetraethoxy silane (TEOS) and 0.01 moles of methyltriethoxy silane (MTEOS) were added to the reactor while stirring with an agitator. In Examples 12-16, the molar ratio of TEOS to MTEOS was varied. The total moles of all monomers were kept at a constant total of 0.1 moles to simplify kinetics measurements. Table 1 below sets forth the specific component amounts used for each Example.

Tetrabutylammonium hydroxide (TBAH) (0.002 moles of 40% aq. solution) or tetramethylammonium hydroxide (TMAH) (0.002 moles of 25% aq. solution) was added as a base catalyst and the reaction mixture was then heated to 35-70° C. for 1-3.5 h. The reaction mixture was then cooled and nitric acid was added to the reaction mixture in a semi-batch fashion to adjust the pH of the reaction mixture to 0.5-1.7. The reaction mixture was then cooled and diluted with IPA, Acetone and/or PGMEA. The molecular weight was measured by Gel permeation chromatography and it ranged from about 25,000-150,000 Dalton depending on reaction conditions. After dilution and pH control the polymer formulation was stored in a −20° C. to −40° C. freezer.

After storing in a frozen state, these formulations were then deposited on glass or transparent substrates. Dip, slot, die, roller and spin coating techniques were attempted. In almost all cases the desired coating thicknesses of 125 nm was obtained by curing at 200-700° C., more favorably at 600-750° C., in air or nitrogen after 3 minutes to 1 hour. A broadband spectroscopy tool available from n&k Technology, Inc. was used for coating thickness measurements. Average polymer particle size in the coating was determined to be between 10 and 100 nm by SEM analysis.

Transmittance data were measured by UV-Visible spectral measurement that measures wavelengths from 300-2500 nm. A broadband spectroscopy tool available from n&k Technology, Inc. was used for refractive index measurements. Tables 1 and 2 provide composition and performance data for Examples 1-16.

A Pencil Hardness test was used as an indicator of scratch resistance/hardness and was performed by attempting to scratch the AR coating with pencils of various hardness (e.g., 3B, 4B, etc.). An Adhesion Tape Test was used as an indicator of coating adhesion and was performed by forming cross-hatches in the coating, pressing an adhesive-backed tape material to the coated substrate, pulling the tape away from the coating and then studying the effect the tape had on the cross-hatched portions of the coating. A Contact Angle Test was used to determine the contact angle of the AR coated substrate using a VCA 2500 instrument available from AST Products, Inc. The results of these tests are shown in Table 2.

TABLE ONE

| Example | Mole TEOS | Mole MTEOS | Mole TBAH | Mole TMAH | Reaction Time (h) |
|---|---|---|---|---|---|
| 1 | 0.09 | 0.01 | 0.0005 | 0 | 3.5 |
| 2 | 0.09 | 0.01 | 0.001 | 0 | 3.5 |
| 3 | 0.09 | 0.01 | 0.002 | 0 | 3.5 |
| 4 | 0.09 | 0.01 | 0.004 | 0 | 2.5 |
| 5 | 0.09 | 0.01 | 0.005 | 0 | 2 |
| 6 | 0.09 | 0.01 | 0.007 | 0 | Gelled |
| 7 | 0.09 | 0.01 | 0 | 0.0005 | 3.5 |
| 8 | 0.09 | 0.01 | 0 | 0.001 | 3.5 |
| 9 | 0.09 | 0.01 | 0 | 0.002 | 2.5 |
| 10 | 0.09 | 0.01 | 0 | 0.003 | Gelled |
| 11 | 0.09 | 0.01 | 0.002 | 0 | 3.5 |
| 12 | 0.08 | 0.02 | 0.002 | 0 | 3.5 |
| 13 | 0.07 | 0.03 | 0.002 | 0 | 3.5 |
| 14 | 0.06 | 0.04 | 0.002 | 0 | 3.5 |
| 15 | 0.05 | 0.05 | 0.002 | 0 | 3.5 |
| 16 | 0.064 | 0.036 | 0.002 | 0 | 3.5 |

TABLE TWO

| Example | Thickness (nm) | % T RI at 550 nm | Gain at 550 nm | Pencil Hardness | Adhesion Tape Test | Contact Angle |
|---|---|---|---|---|---|---|
| 1 | 125 | 1.2 | 4 | 3B | Poor | <10 |
| 2 | 125 | 1.2 | 4 | 3B | Poor | <10 |
| 3 | 125 | 1.19 | 4 | 3B | Acceptable | <10 |
| 4 | 125 | 1.18 | 4 | 3B | Acceptable | <10 |
| 5 | 125 | 1.16 | 3.8 | 2B | Acceptable | <10 |
| 6 | — | — | — | — | — | — |
| 7 | 125 | 1.16 | 4 | 4B | Excellent | <10 |
| 8 | 125 | 1.17 | 4 | 4B | Excellent | <10 |
| 9 | 125 | 1.18 | 3.8 | 4B | Excellent | <10 |
| 10 | — | — | — | — | — | — |
| 11 | 125 | 1.2 | 4 | 3B | Poor | <10 |
| 12 | 125 | 1.2 | 4 | 3B | Poor | <10 |
| 13 | 125 | 1.2 | 4 | 3B | Acceptable | <10 |
| 14 | 125 | 1.2 | 4 | 3B | Acceptable | >10 |
| 15 | 125 | 1.2 | 3.8 | 2B | Acceptable | >10 |
| 16 | 125 | 1.23 | 3.2-3.5 | 1H-3H | Excellent | <10 |

It was observed that about 0.0005 to about 0.003, or more particularly, about 0.002 mole of TBAH resulted in an optimized rate of reaction. Lower amounts of TBAH slowed the rate of reaction, whereas, higher amounts increased the reaction rate to gel formation level.

It was determined that Examples 1-16 all had refractive indices near 1.23 and percent transmission gains (over uncoated substrates) of up to 4%. Pencil hardness results generally indicated an acceptable scratch resistance, with Example 16 having particularly high scratch resistance. Examples 3-5, 7-9 and 16 also exhibited acceptable to excellent coating adhesion using the Adhesion Tape Test.

Example 11 was also modified to include 0.00015 mole of diethylphosphatoethyltriethoxy silane (while maintaining 1 mole total monomer), in the reaction solution. This improved hardness and adhesion, however, the refractive index of the coated film increased from 1.2 to 1.3. Certain examples were also treated with a 50-50 mixture of ethanol and water before curing in order to remove TBAN (tetrabutyl ammonium nitrate) that would otherwise be present on the film as a result of reaction between the TBAH and the nitric acid. It was found that this washing step further improved the hardness of the films. In some cases a hardness of 3H could be achieved by this treatment prior to the curing step.

Example 16 was further subjected to several durability tests as set forth in Table 3 below to determine whether adhesion or transmittance was lost.

TABLE THREE

| Parameter | Test Conditions | Result |
|---|---|---|
| Salt spray test(DIN50021) | in salt (5% NaCl) chamber at 35° C. for 96 h and then in DI water rinse and air dry | Pass |
| Climate variable test (IEC1215) | −40 to +85° C., 100 cycle | Pass |
| Damp test (IEC61250) | 130° C., 85% humidity, 96 h | Pass |
| Boiling DI water test | submerge in boiling water for 30 min and then rub coating with a paper soaked in n-propanol | Pass |
| Abrasion resistance (ISO-9211-3-1-02) | linear abraiser, 500 g weight, 500 rubs | Pass |
| UV stability | exposed under UV light @ 254 nm at room temperature for 1 h | Pass |
| Acid test (DIN50018) | 0.67% sulfuric/sulfurous acid, 40° C., 20 cycle of 2.5 min each | Pass |
| Base test | same as acid test but with 0.67% aq. NaOH | Pass |

A "pass" indicated less than 0.02 loss of transmittance and no detectable chance in adhesion. As shown above, Example 16 passed all durability tests.

Samples of Example 16 was further tested to confirm stability after approximately ten days at room temperature. As shown in Table Four below, coating solution samples were formed having varying molar concentrations of polymer material.

TABLE FOUR

| | Samples of Example 16 | | | | |
|---|---|---|---|---|---|
| Item | 2% | 3% | 4% | 16% | Comments (condition: RT) |
| Density(g/ml) | 0.814 | 0.814 | 0.815 | 0.819 | Weight 20 ml solution |
| Solid content(%) | 0.81 | 1.25 | 1.72 | 6.68 | ASTM D1644, 150 C. 30 min |

TABLE FOUR-continued

| | Samples of Example 16 | | | | |
|---|---|---|---|---|---|
| Item | 2% | 3% | 4% | 16% | Comments (condition: RT) |
| Viscosity(cP) | 0.76 | 0.80 | 0.83 | 1.81 | ASTM D446, Cannon-Fenske viscometer tube |
| PH value | ~4 | ~4 | ~4 | ~3 | PH test paper |

The results shown in Table 4, indicate that the samples maintained a viscosity of less than 2.0 cP and a pH of about 3-4 after storage, which confirmed stability of the coating solution.

Examples 17-42

Tables 5-6 provide composition and performance data for Examples 17-42, in which different types and amounts of one or more adhesion promoting materials were added. In Examples 17-40, 122 grams of isopropanol and 62 grams of acetone were charged into a reactor. In Examples 41-42, 366 grams of isopropanol and 250 grams of acetone were charged in a reactor.

In each example, tetraethoxy silane (TEOS) and/or methyltriethoxy silane (MTEOS) were added to the reactor while stirring with an agitator. At least one of VTEOS, DMDEOS, MDEOS and/or TIPO was also added.

In Examples 17-40, TBAH (0.002 moles of 40% aq. solution) was used as the base. In Examples 41 and 42, 0.006 moles of TBAH was added as a base catalyst, and additional water was also added.

The reaction mixture was then heated to 35-70° C. for 3.5 h. The reaction mixture was then cooled to 45° C. and nitric acid was added to the reaction mixture in a semi-batch fashion to adjust the pH of the reaction mixture to 0.5-1.7. The reaction mixture was then cooled and diluted with IPA, Acetone, PGMEA, and/or water. In Examples 41 and 42, the reaction mixture was diluted with a combination of 14 weight percent PGMEA, 46.472 weight percent IPA, 37.38 weight percent acetone and 1.87 weight percent water.

After dilution and pH control the polymer formulation was stored in a −20° C. to −40° C. freezer. The molecular weight was measured by GPC and it was around 25,000-150,000 Dalton depending on reaction conditions.

These formulations were then deposited on glass substrates by spin coating. In almost all cases the desired coating thicknesses of 125 nm was obtained after cure at 200-700° C., more favorably at 600-750° C., in air or nitrogen after 3 minutes to 1 hour.

The same tests performed on Examples 1-16 were performed on Examples 17-40 and are set forth in Table 6. Examples 41 and 42 included slightly different tests, including average light transmission gain from 350 to 1200 nm and a Surface Roughness (RMS) Test, as set forth in Table 7, which was measured by scanning force microscopy. The Scratch Test was measured pursuant to EN-1096-2.

TABLE FIVE

| Example | TEOS (moles) | MTEOS (moles) | DMDEOS (moles) | MDEOS (moles) | Water (moles) | VTEOS (moles) | TIPO (moles) |
|---|---|---|---|---|---|---|---|
| 17 | 0.095 | 0 | 0.005 | 0 | 0 | 0 | 0 |
| 18 | 0.09 | 0 | 0.01 | 0 | 0 | 0 | 0 |
| 19 | 0.085 | 0 | 0.015 | 0 | 0 | 0 | 0 |
| 20 | 0.08 | 0 | 0.02 | 0 | 0 | 0 | 0 |
| 21 | 0.089 | 0.01 | 0 | 0.001 | 0 | 0 | 0 |
| 22 | 0.088 | 0.01 | 0 | 0.002 | 0 | 0 | 0 |
| 23 | 0.087 | 0.01 | 0 | 0.003 | 0 | 0 | 0 |
| 24 | 0.086 | 0.01 | 0 | 0.004 | 0 | 0 | 0 |
| 25 | 0.085 | 0.01 | 0 | 0.005 | 0 | 0 | 0 |
| 26 | 0.087 | 0.005 | 0.005 | 0.003 | 0 | 0 | 0 |
| 27 | 0.0885 | 0.01 | 0 | 0 | 0 | 0.0015 | 0 |
| 28 | 0.087 | 0.01 | 0 | 0 | 0 | 0.003 | 0 |
| 29 | 0.0855 | 0.01 | 0 | 0 | 0 | 0.0045 | 0 |
| 30 | 0.085 | 0.01 | 0 | 0 | 0 | 0.005 | 0 |
| 31 | 0.0891 | 0.01 | 0 | 0 | 0 | 0.0009 | 0 |
| 32 | 0.089 | 0.01 | 0 | 0 | 0 | 0.001 | 0 |
| 33 | 0.0899 | 0.01 | 0 | 0 | 0 | 0 | 0.0001 |
| 34 | 0.0897 | 0.01 | 0 | 0 | 0 | 0 | 0.0003 |
| 35 | 0.0895 | 0.01 | 0 | 0 | 0 | 0 | 0.0005 |
| 36 | 0.088 | 0.01 | 0 | 0 | 0 | 0 | 0.0002 |
| 37 | 0.087 | 0.01 | 0 | 0 | 0 | 0 | 0.0003 |
| 38 | 0.087 | 0.01 | 0 | 0.0015 | 0 | 0.0015 | 0 |
| 39 | 0.084 | 0.01 | 0 | 0.003 | 0 | 0.0003 | 0 |
| 40 | 0.0865 | 0.005 | 0.005 | 0.0015 | 0 | 0.0015 | 0.0005 |
| 41 | 0.37 | 0.21 | 0 | 0 | 0.712 | 0.006 | 0 |
| 42 | 0.37 | 0.21 | 0 | 0 | 0.712 | 0.006 | 0.001 |

TABLE SIX

| Example | Thickness (nm) | RI at 550 nm | % T Gain at 550 nm | Pencil Hardness | Adhesion Tape Test | Contact Angle |
|---|---|---|---|---|---|---|
| 17 | 125 | 1.18 | 4 | 6B | Acceptable | <10 |
| 18 | 125 | 1.18 | 4 | 6B | Acceptable | <10 |
| 19 | 125 | 1.18 | 4 | 6B | Acceptable | <10 |
| 20 | 125 | 1.18 | 4 | 6B | Acceptable | >10 |

TABLE SIX-continued

| Example | Thickness (nm) | RI at 550 nm | % T Gain at 550 nm | Pencil Hardness | Adhesion Tape Test | Contact Angle |
|---|---|---|---|---|---|---|
| 21 | 125 | 1.19 | 4 | HB | Excellent | <10 |
| 22 | 125 | 1.19 | 4 | HB | Excellent | <10 |
| 23 | 125 | 1.19 | 4 | HB | Excellent | <10 |
| 24 | 125 | 1.19 | 3.8 | HB | Excellent | <10 |
| 25 | 125 | 1.19 | 3.6 | HB | Excellent | <10 |
| 26 | 125 | 1.18 | 4 | HB | Excellent | <10 |
| 27 | 125 | 1.21 | 4 | H | Excellent | <10 |
| 28 | 125 | 1.21 | 4 | H | Excellent | >10 |
| 29 | 125 | 1.21 | 3.8 | H | Excellent | <10 |
| 30 | 125 | 1.22 | 3.6 | H | Excellent | <10 |
| 31 | 125 | 1.23 | 3.5 | 2H | Excellent | >10 |
| 32 | 125 | 1.24 | 2.9 | 2H | Excellent | >10 |
| 33 | 125 | 1.25 | 4 | H | Excellent | <10 |
| 34 | 125 | 1.2 | 4 | H | Excellent | <10 |
| 35 | 125 | 1.2 | 3.8 | H | Excellent | >10 |
| 36 | 125 | 1.2 | 2.9 | H | Poor | >10 |
| 37 | 125 | 1.2 | 3.5 | H | Poor | >10 |
| 38 | 125 | 1.21 | 4 | 2H | Excellent | >10 |
| 39 | 125 | 1.24 | 3.6 | 3H | Excellent | >10 |
| 40 | 125 | 1.25 | 3.5 | 3H | Excellent | >10 |

TABLE SEVEN

| Example | Thickness (nm) | Average % T Gain (350-1200 nm) | Scratch Test | Adhesion Tape Test | Surface Roughness (RMS) |
|---|---|---|---|---|---|
| 41 | 125 | 3.1 | pass | pass | <1 Å |
| 42 | 125 | 3.0 | pass | pass | <1 Å |

Examples 17-42 indicate that the addition of VTEOS, DMDEOS, MDEOS and TIPO improved certain physical characteristics of the AR coatings, including scratch resistance/hardness and/or adhesion. VTEOS, in particular, appeared to improve film hardness and uniformity.

It was also determined that the reactions described herein can be scaled up to 100 to 1000 liter batch sizes without difficulty or losses in the resulting optical and mechanical properties of the resulting film.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

The invention claimed is:

1. An optically transparent element comprising:
an optically transparent substrate; and
an anti-reflective coating disposed on at least one surface of the optically transparent substrate, the anti-reflective coating comprising a polymer having an average particle size of between 1 nm and 100 nm, the polymer consisting essentially of tetraethoxy silane residues and methyltriethoxy silane residues;
the polymer comprising at least 50 mole percent of the tetraalkoxy silane residues based on the total moles of polymer;
the polymer comprising between 35 and 50 mole percent of the methyltriethoxy silane residues based on the total moles of polymer; and
the anti-reflective coating having a refractive index of less than 1.28.

2. The optically transparent element of claim 1, wherein the coating comprises polymer particles having an average size between 25 nm and 75 nm.

3. The optically transparent element of claim 1, wherein the anti-reflective coating has a refractive index of between 1.15 and 1.25.

4. The optically transparent element of claim 1, wherein the coating has a pencil hardness of at least 2H.

5. The optically transparent element of claim 1, wherein said substrate is glass.

6. The optically transparent element of claim 1, wherein said coating has a contact angle of less than 10.

7. The optically transparent element of claim 1, wherein said polymer is a polycondensate resulting from hydrolysis and polycondensation of tetraethoxy silane and methyltriethoxy silane.

8. The optically transparent element of claim 1, wherein said anti-reflective coating has a refractive index of 1.16 or greater and less than 1.28, and a pencil hardness of at least 2H.

9. An optically transparent element comprising:
an optically transparent glass substrate; and
a silica-based anti-reflective coating disposed on at least one surface of the optically transparent substrate, the anti-reflective coating comprising a polymer derived from at least two different alkoxysilane precursors and including at least one first tetraalkoxy silane residue, and at least one second alkoxy silane residue selected from the group consisting of trialkoxy silanes, dialkoxy silanes, monoalkoxy silanes, and combinations thereof, the polymer comprising between 35 and 50 mole percent of the at least one second alkoxy silane residue based on the total moles of polymer and having a refractive index of 1.3 or less and a pencil hardness of at least 2H.

10. The optically transparent element of claim 9, wherein the anti-reflective coating has a refractive index of between 1.15 and 1.25.

11. The optically transparent element of claim 9, wherein the at least one first tetraalkoxy silane residue comprises tetraethoxy silane and the at least one second alkoxy silane comprises methyltriethoxy silane.

12. The optically transparent element of claim 9, wherein the coating comprises polymer particles having an average size between 1 nm and 100 nm.

13. The optically transparent element of claim 9, wherein the at least one second alkoxy silane residue is selected from the group consisting of trialkoxy silanes, monoalkoxy silanes, and combinations thereof.

14. The optically transparent element of claim 9, wherein said coating has a contact angle of less than 10.

15. The optically transparent element of claim 9, wherein said polymer is a polycondensate resulting from hydrolysis and polycondensation of tetraethoxy silane and the at least one second alkoxy silane selected from the group consisting of trialkoxy silanes, dialkoxy silanes, monoalkoxy silanes, and combinations thereof.

16. The optically transparent element of claim 9, wherein said anti-reflective coating has a refractive index of 1.16 or greater and less than 1.28.

17. The optically transparent element of claim 9, wherein the coating comprises polymer particles having an average size between 25 nm and 75 nm.

* * * * *